(12) United States Patent
Lee et al.

(10) Patent No.: US 12,490,467 B2
(45) Date of Patent: Dec. 2, 2025

(54) TRANSISTOR AND SEMICONDUCTOR DEVICE WITH MULTIPLE THRESHOLD VOLTAGES AND FABRICATION METHOD THEREOF

(71) Applicant: Taiwan Semiconductor Manufacturing Company, Ltd., Hsinchu (TW)

(72) Inventors: Shen-Yang Lee, Miaoli County (TW); Hsiang-Pi Chang, New Taipei (TW); Huang-Lin Chao, Hillsboro, OR (US)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 438 days.

(21) Appl. No.: 18/151,481

(22) Filed: Jan. 9, 2023

(65) Prior Publication Data

US 2024/0096993 A1    Mar. 21, 2024

Related U.S. Application Data

(60) Provisional application No. 63/407,732, filed on Sep. 19, 2022.

(51) Int. Cl.
| | |
|---|---|
| *H10D 30/67* | (2025.01) |
| *H10D 64/01* | (2025.01) |
| *H10D 84/01* | (2025.01) |
| *H10D 84/03* | (2025.01) |

(52) U.S. Cl.
CPC ..... *H10D 30/6735* (2025.01); *H10D 30/6757* (2025.01); *H10D 64/017* (2025.01); *H10D 84/0128* (2025.01); *H10D 84/013* (2025.01); *H10D 84/0158* (2025.01); *H10D 84/038* (2025.01)

(58) Field of Classification Search
CPC .. H10D 30/6735; H10D 30/014; H10D 30/43; H10D 62/121; H10D 84/0144; H10D 84/0181; H10D 84/0177
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |

(Continued)

*Primary Examiner* — Tuan A Hoang
(74) *Attorney, Agent, or Firm* — JCIPRNET

(57) ABSTRACT

A method for tuning a threshold voltage of a transistor is disclosed. A channel layer is formed over a substrate. An interfacial layer is formed over and surrounds the channel layer. A gate dielectric layer is formed over and surrounds the interfacial layer. A dipole layer is formed over and wraps around the gate dielectric layer by performing a cyclic deposition etch process, and the dipole layer includes dipole metal elements and has a substantially uniform thickness. A thermal drive-in process is performed to drive the dipole metal elements in the dipole layer into the gate dielectric layer to form an interfacial dipole surface, and then the dipole layer is removed.

20 Claims, 26 Drawing Sheets

(56) References Cited

U.S. PATENT DOCUMENTS 9,608,116 B2     3/2017   Ching et al.
2021/0082915 A1*   3/2021   Bao ..................... H10D 84/853
2022/0384469 A1*   12/2022   Yang ................. H10D 84/0144

* cited by examiner

120# TRANSISTOR AND SEMICONDUCTOR DEVICE WITH MULTIPLE THRESHOLD VOLTAGES AND FABRICATION METHOD THEREOF

CROSS-REFERENCE TO RELATED APPLICATION

This application claims the priority benefit of U.S. provisional application Ser. No. 63/407,732, filed on Sep. 19, 2022. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
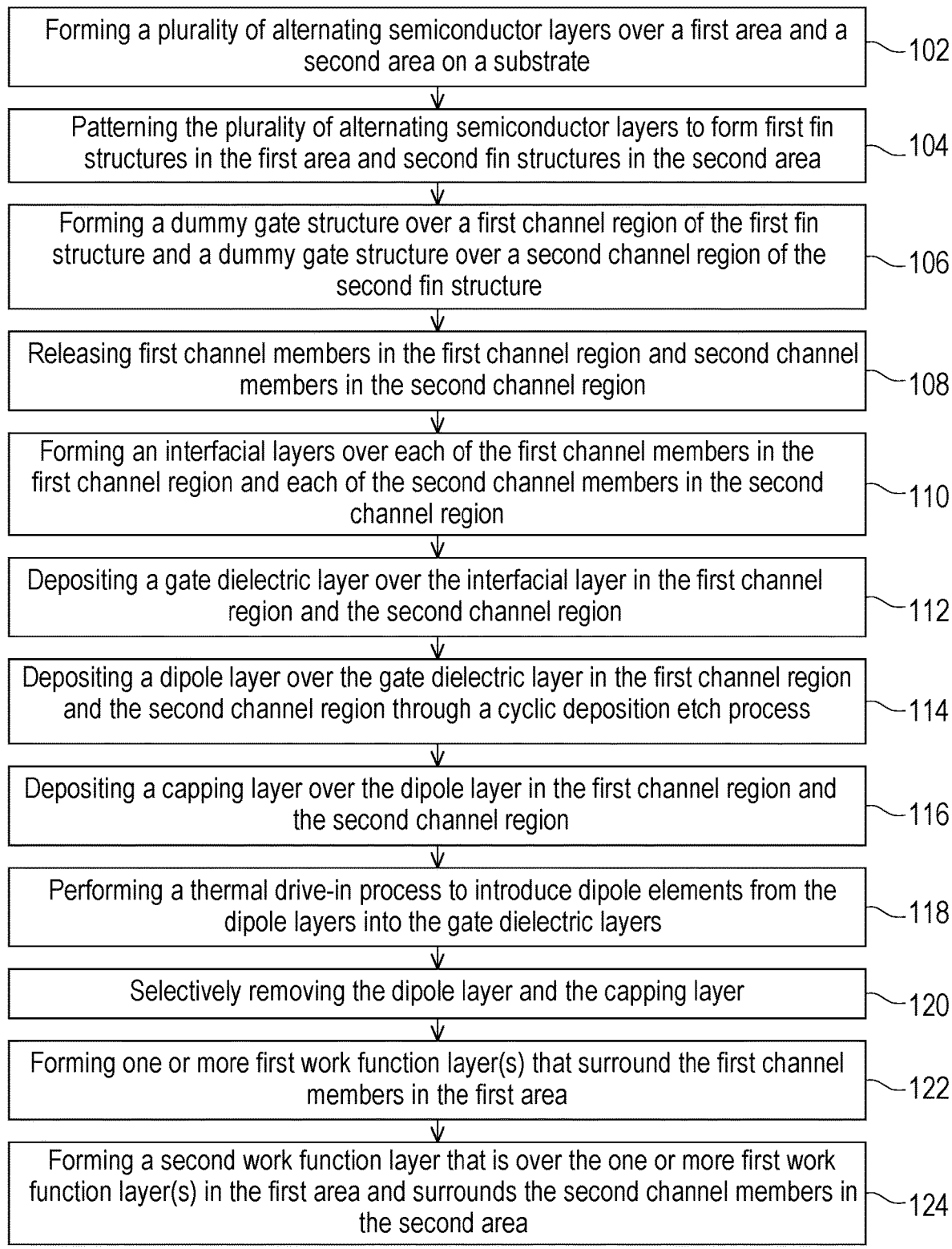
FIG. 1 is a flowchart illustrating process flows of a method for fabricating a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending on the order of the presence or the contexts of the description. Source/drain structure(s) may refer to a source or a drain, individually or collectively dependent upon the context.

Due to the increasing demand for multi-functional portable devices, there is an increasing demand for field effect transistors (FETs) with different threshold voltages (Vt) on the same substrate. Generally, such FETs can be achieved by varying the thicknesses of work function metal (WFM) layers in the FET gate structures. However, thicknesses of the WFM layers may be constrained by the FET gate structure geometries. For example, in gate-all-around (GAA) FETs, the thicknesses of the WFM layers may be constrained by the spacing between the nanostructured channel regions of the GAA FETs. Also, depositing different WFM layers with precisely required thickness becomes increasingly challenging with the continuous scaling down of FETs (e.g., GAA FETs and/or finFETs). One way to achieve multiple threshold voltages for FETs with more advanced technology nodes is to incorporate surface dipole layer into the gate dielectric layers of the devices.

The present disclosure provides embodiments related to methods of tuning threshold voltage in transistor devices and the transistor devices formed thereby. More specifically, in some examples, a dipole layer for subsequent introduction of dipole metal elements into the gate dielectric layer is formed over the gate dielectric layer in order to tune the threshold voltage of the semiconductor device to a desired value. A uniform dopant distribution of the dipole metal elements in the gate dielectric layer can be achieved by using a cyclic deposition etch (CDE) process in an atomic layer deposition (ALD) chamber to form a dipole layer having a substantially uniform thickness and conformally covering the gate dielectric layer. As a result, the threshold voltage of the transistor is adjusted to the desirable value with minimal variation. Such approach may be further implemented in combination with or without forming additional work-function tuning layers in the gates to tune the threshold voltages.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The various aspects of the present disclosure will now be described in more detail with reference to the figures. FIG. 1 is a flowchart illustrating the process flows of a method 100 for fabricating a semiconductor device 200 in accordance with some embodiments of the disclosure. The method illustrated in FIG. 1 will be described below in conjunction with FIGS. 2-5, and 6-25, which are schematic perspective views and fragmentary cross-sectional views of a structure 200 at various stages of fabrication in accordance with the method 100 in FIG. 1. Throughout the present disclosure, for the ease of reference, the structure and the semiconductor device may be referred to interchangeably because the structure is to become the semiconductor device upon the conclusion of its fabrication processes and may share the same reference numeral. It is understood that additional steps can be provided before, during, and after method 100, and some of the steps described can be moved, replaced, or eliminated for additional embodiments of method 100. In addition, additional features can be added in the semiconductor device depicted in FIGS. 2-5, and 6-25 and some of the features described below can be replaced, modified, or eliminated in other embodiments of the semiconductor device.

Figure 2:
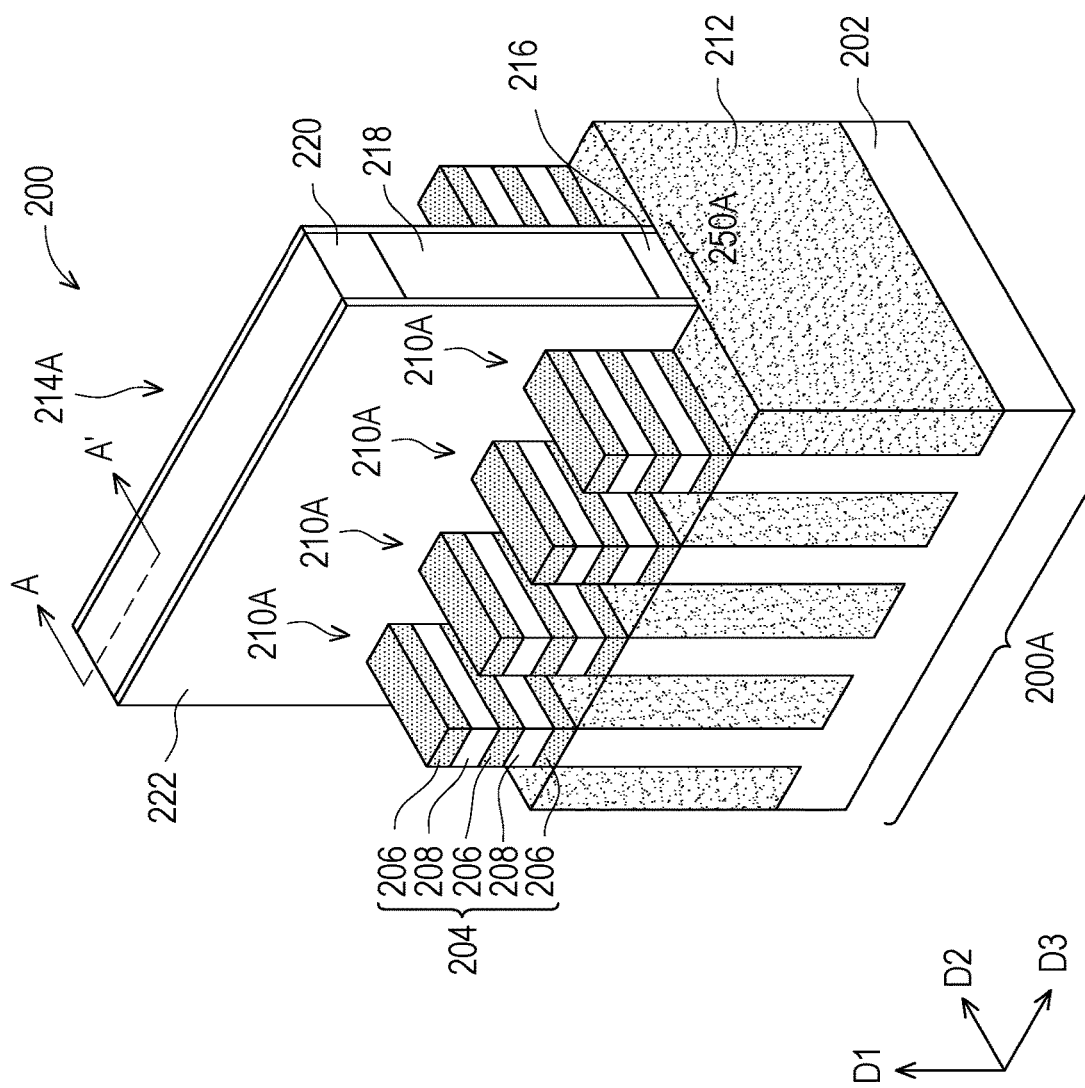
FIG. 2 is a schematic perspective view of a first area of a structure in accordance with some embodiments of the disclosure.
Figure 3:
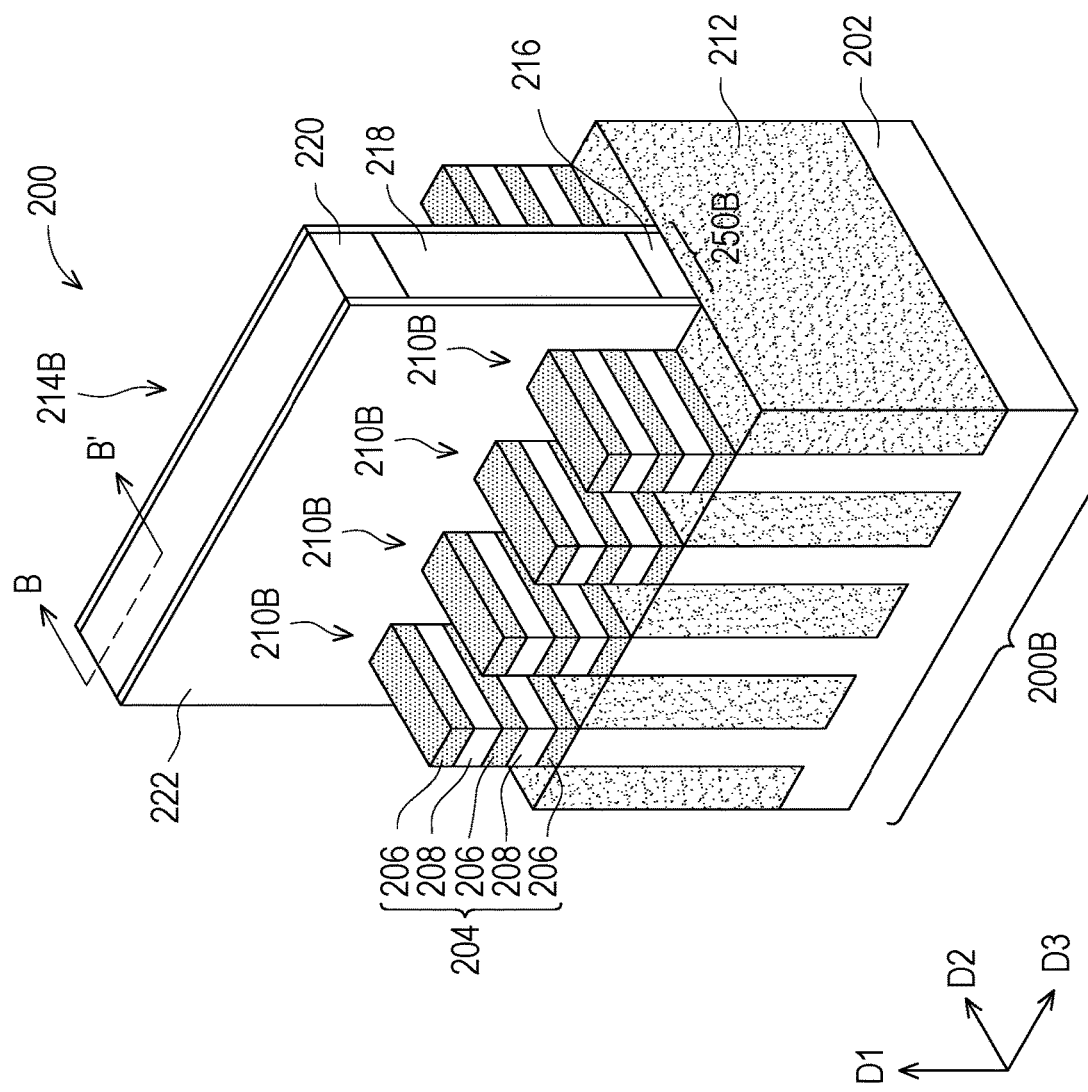
FIG. 3 is a schematic perspective view of a second area of a structure in accordance with some embodiments of the disclosure.

Referring to FIG. 1 and FIGS. 2-3 together, the method 100 includes a step 102 where a plurality of alternating semiconductor layers 204 is formed over a first area 200A and a second area 200B on a substrate 202 of a structure 200. The first area 200A and the second area 200B of the structure 200 are shown in perspective views of FIG. 2 and FIG. 3, respectively. In some embodiments, the first area 200A and the second area 200B represent device areas including different types of transistors, and those transistors may have different threshold voltages. For example, the first area 200A includes an n-type device area featured by a first threshold voltage, and the second area 200B includes a p-type device area featured by a second threshold voltage. In embodiments, as the first area and the second area include different types of transistors, the structure 200 (i.e., semiconductor device 200) may be a complementary metal-oxide-semiconductor (CMOS) device.

In some embodiments, the substrate 202 includes a bulk silicon substrate. Alternatively or additionally, substrate 202 may include another elementary semiconductor, such as germanium; a compound semiconductor, such as silicon carbide, gallium arsenide, gallium phosphide, indium phosphide, indium arsenide, and/or indium antimonide; an alloy semiconductor, such as SiGe, GaAsP, AlInAs, AlGaAs, GaInAs, GaInP, and/or GaInAsP; or a combination thereof. In some other embodiments, the substrate 202 is a semiconductor-on-insulator substrate, such as a silicon-on-insulator (SOI) substrate, a silicon germanium-on-insulator (SGOI) substrate, or a germanium-on-insulator (GOI) substrate. The substrate 202 may further include various doped regions configured according to design requirements of semiconductor device 200.

In some embodiments, the plurality of alternating semiconductor layers 204 is formed over the substrate 202, and the plurality of alternating semiconductor layers 204 includes a plurality of first semiconductor layers 206 and a plurality of second semiconductor layers 208 alternatively stacked on each other. That is, one second semiconductor layer 208 is sandwiched between two neighboring first semiconductor layers 206. In some embodiments, the plurality of first semiconductor layers 206 is formed of a first semiconductor material and the plurality of second semiconductor layers 208 is formed of a second semiconductor material that is different from the first semiconductor material. For example, the first semiconductor material is or consists essentially of silicon germanium (SiGe) and the second semiconductor material is or consists essentially of silicon (Si). Alternatively, the first semiconductor material is or consists essentially of germanium (Ge) and the second semiconductor material is or consists essentially of silicon (Si). In some embodiments, the plurality of alternating semiconductor layers 204 is formed by depositing or epitaxially growing the plurality of first semiconductor layers 206 and the plurality of second semiconductor layers 208 alternatingly along a first direction D1.

Still referring to FIG. 1 and FIGS. 2-3, the method 100 includes a step 104 where first fin structures 210A are formed in the first area 200A and second fin structures 210B are formed in the second area 200B by patterning the plurality of alternating semiconductor layers 204. As shown in FIG. 2 and FIG. 3, the first fin structures 210A and the second fin structures 210B extend along a second direction D2, and each of the first fin structure 210A and the second fin structures 210B is spaced apart from each other in a third direction D3. The first direction D1, the second direction D2, and the third direction D3 are perpendicular to one another. In some embodiments, the first fin structures 210A and the second fin structures 210B are patterned by using suitable processes such as photolithography and etching processes. For example, the fin structures are etched from the plurality of alternating semiconductor layers 204 using dry etch or plasma etch processes. In some other embodiments, the fin structures may be formed by a double-patterning lithography process or a multiple-patterning lithography process. Generally, the double-patterning lithography process and the multiple-patterning lithography process combine photolithography and self-aligned processes, allowing patterns to be created that have, for example, pitches smaller than what is otherwise obtainable using a single, direct photolithography process. In some embodiments, isolation regions 212 such as shallow trench isolation (STI) are formed among the first fin structures 210A and the second fin structures 210B. Further, in some embodiments, the isolation regions 212 are formed of an insulation material such as silicon oxide, silicon nitride, or a combination thereof, and may be deposited using a high-density plasma CVD (HDP-CVD) process, a flowable CVD (FCVD) process, or a combination thereof.

Referring again to FIG. 1 and FIGS. 2-3, the method 100 includes a step 106 where a dummy gate structure 214A is formed over a first channel region 250A of the first fin structure 210A and a dummy gate structure 214B is formed over a second channel region 250B of the second fin structure 210B. In some embodiments, the dummy gate structures 214A, 214B are formed extending along the direction D2. As illustrated in FIG. 2 and FIG. 3, each of the dummy gate structures 214A, 214B includes a dummy gate dielectric layer 216, a dummy gate electrode 218, a hard mask 220, and a gate spacer 222. In some embodiments, the dummy gate electrode 218 is formed of polysilicon and the dummy gate dielectric layer 216 is formed of silicon oxide, or silicon oxynitride. The hard mask 220 may be formed of silicon oxide or silicon nitride. In addition, the gate spacer 222 extends along sidewalls of the dummy gate electrode 218 and respectively defines the first channel region 250A and the second channel region 250B. In some embodiments, the gate spacer 222 is formed of silicon oxide, silicon oxynitride, silicon nitride, silicon oxycarbonitride, a low-k dielectric material, or a combination thereof.

In some embodiments, after the dummy gate structures 214A, 214B are formed, the dummy gate structures 214A, 214B are used as an etch mask to recess the first fin structure 210A and the second fin structure 210B to form source/drain trenches (not shown) exposing sidewalls of the plurality of first semiconductor layers 206 and the plurality of the second semiconductor layers 208 in the first channel region 250A and the second channel region 250B. For example, the source/drain trenches are formed on opposite sides of the dummy gate structures 214A, 214B in the second direction D2.

Figure 4:
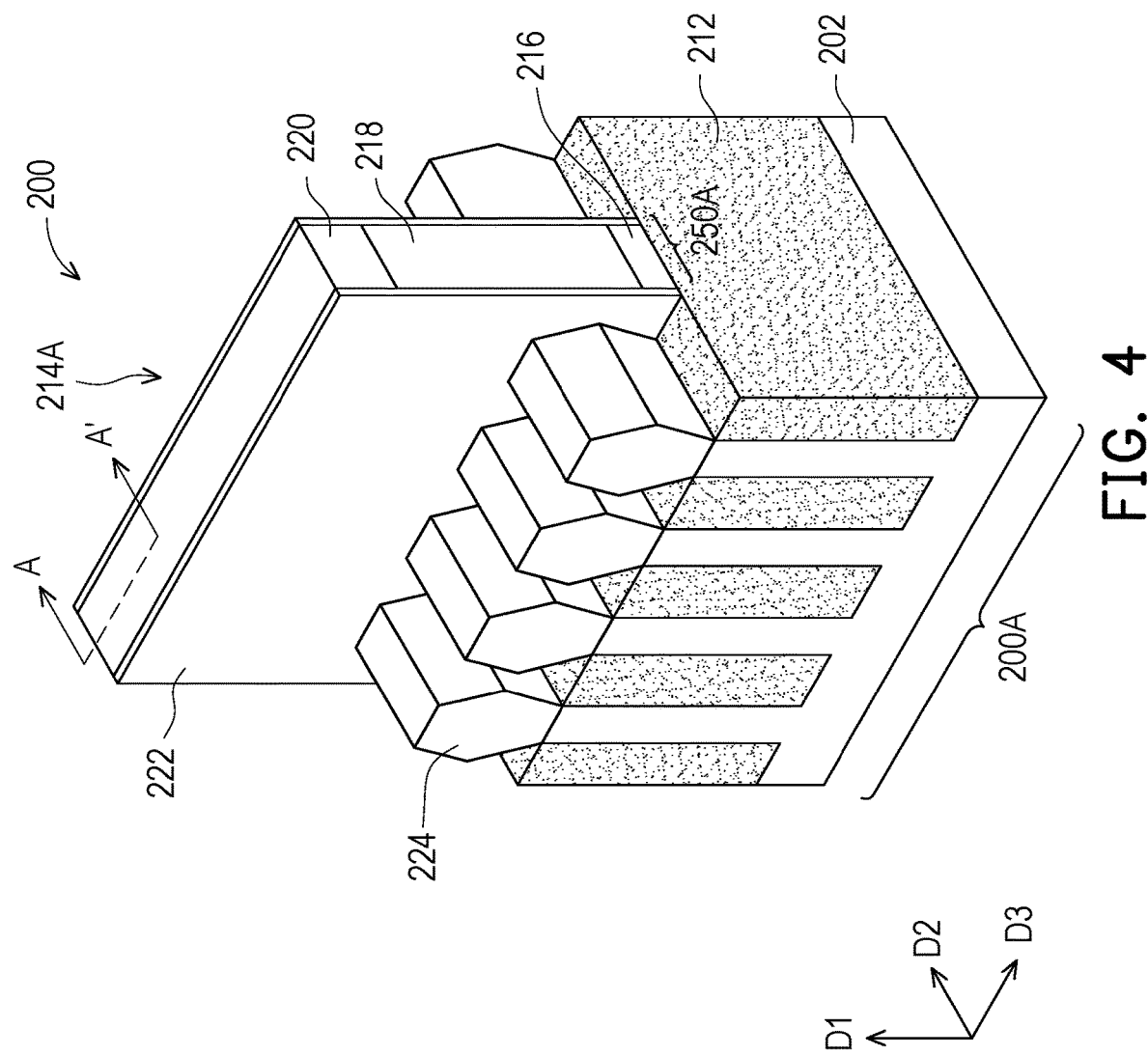
FIG. 4 is a schematic perspective view of a first area of a structure in accordance with some embodiments of the disclosure.
Figure 5:
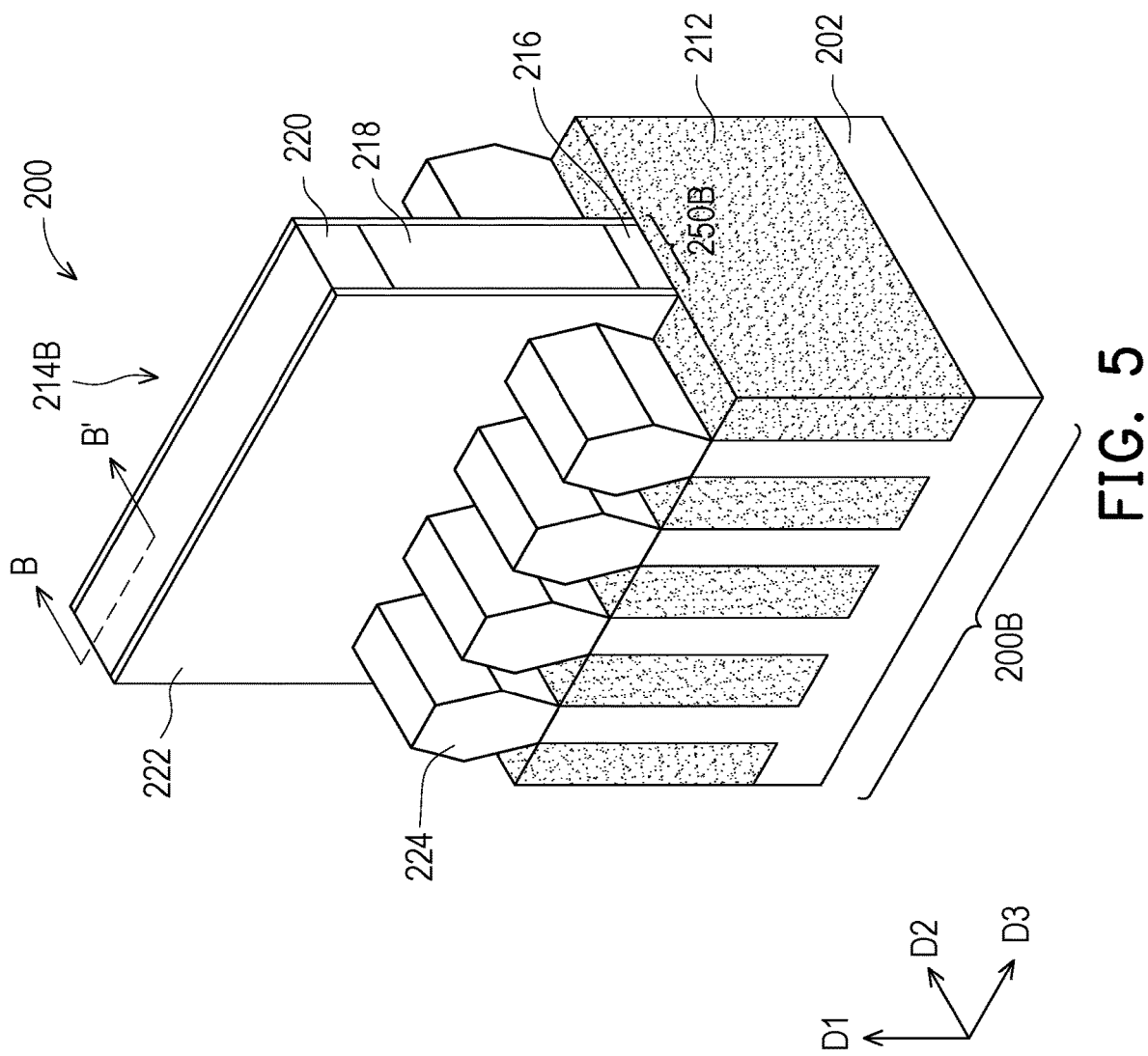
FIG. 5 is a schematic perspective view of a second area of a structure in accordance with some embodiments of the disclosure.

In some embodiments, the plurality of the second semiconductor layers 208 in the first channel region 250A and the plurality of the second semiconductor layers 208 in the second channel region 250B are selectively and laterally etched to form inner spacer recesses (not shown) between two of the plurality of first semiconductor layers 206. Inner spacer features (not shown) is then formed within the inner spacer recesses, and epitaxial source/drain features 224 are then formed in the source/drain trenches at opposite sides of the channel regions 250A, 250B. The resultant structure is shown in FIGS. 4 and 5. Afterwards, an interlayer dielectric (ILD) layer (not shown) is formed and planarized by a chemical mechanical polishing (CMP) process until the dummy gate electrode 218 is exposed, and the exposed dummy gate electrode 218 is then removed using a suitable dry etch or wet etch process without removing the gate spacers 222. Gate trenches 261 (see FIG. 7) are defined by the remained gate spacers 222.

For clarity of description and illustration, each figure of FIGS. 6-25 includes a fragmentary cross-sectional view of a first fin structure 210A along the section A-A' shown in FIG. 2 and FIG. 4, and a fragmentary cross-sectional view of a second fin structure 210B along the section B-B' shown in FIG. 3 and FIG. 5. As shown in FIG. 2 and FIG. 4, the section A-A' extends along the dummy gate structure 214A and passes the first channel region 250A. As shown in FIG. 3 and FIG. 5, the section B-B' extends along the dummy gate structure 214B and passes the second channel region 250B.

Figure 6:
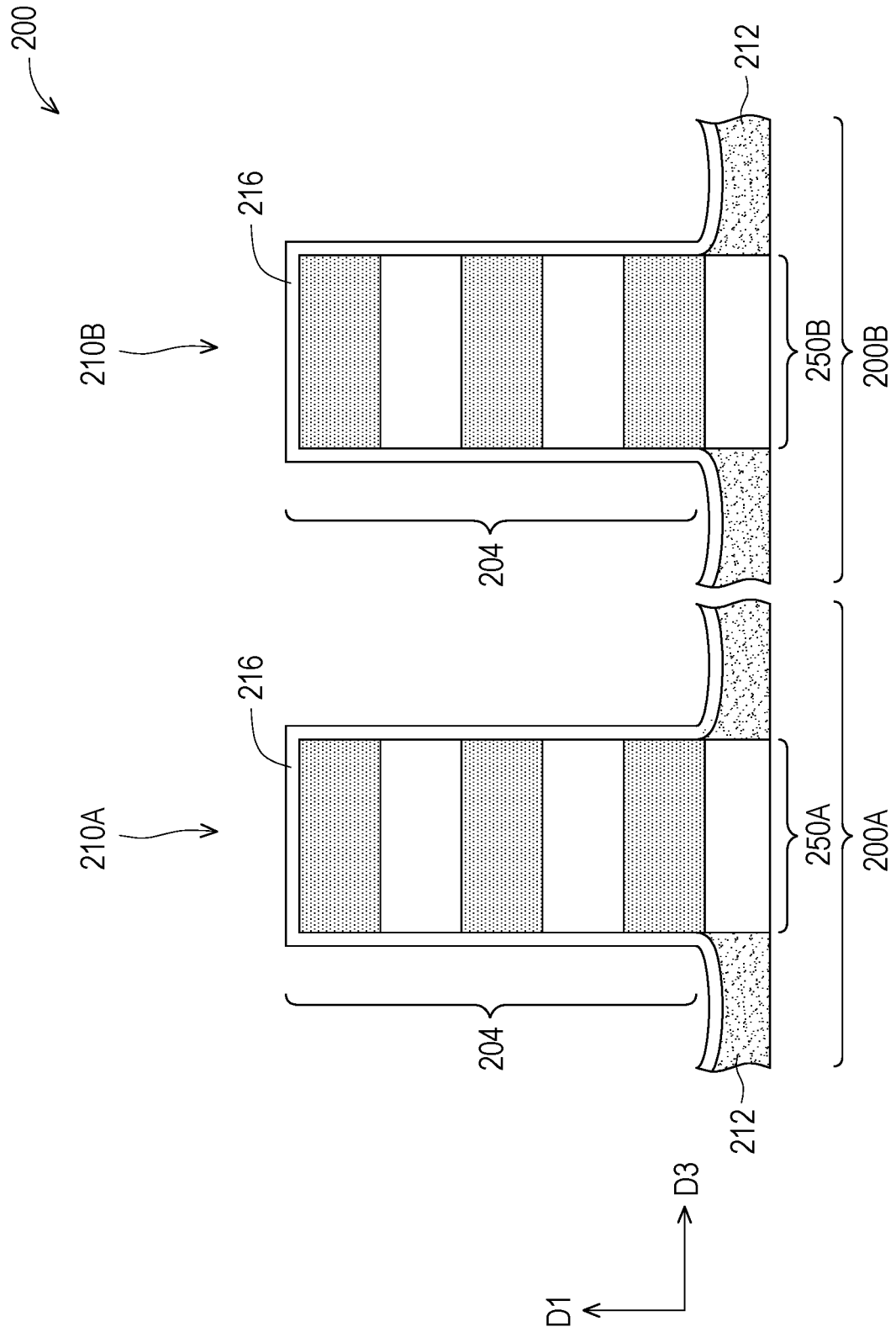
FIG. 6 through FIG. 25 are fragmentary cross-sectional views of the first area and the second area of the structure at various stages of fabrication in accordance with the method in FIG. 1.
Figure 7:
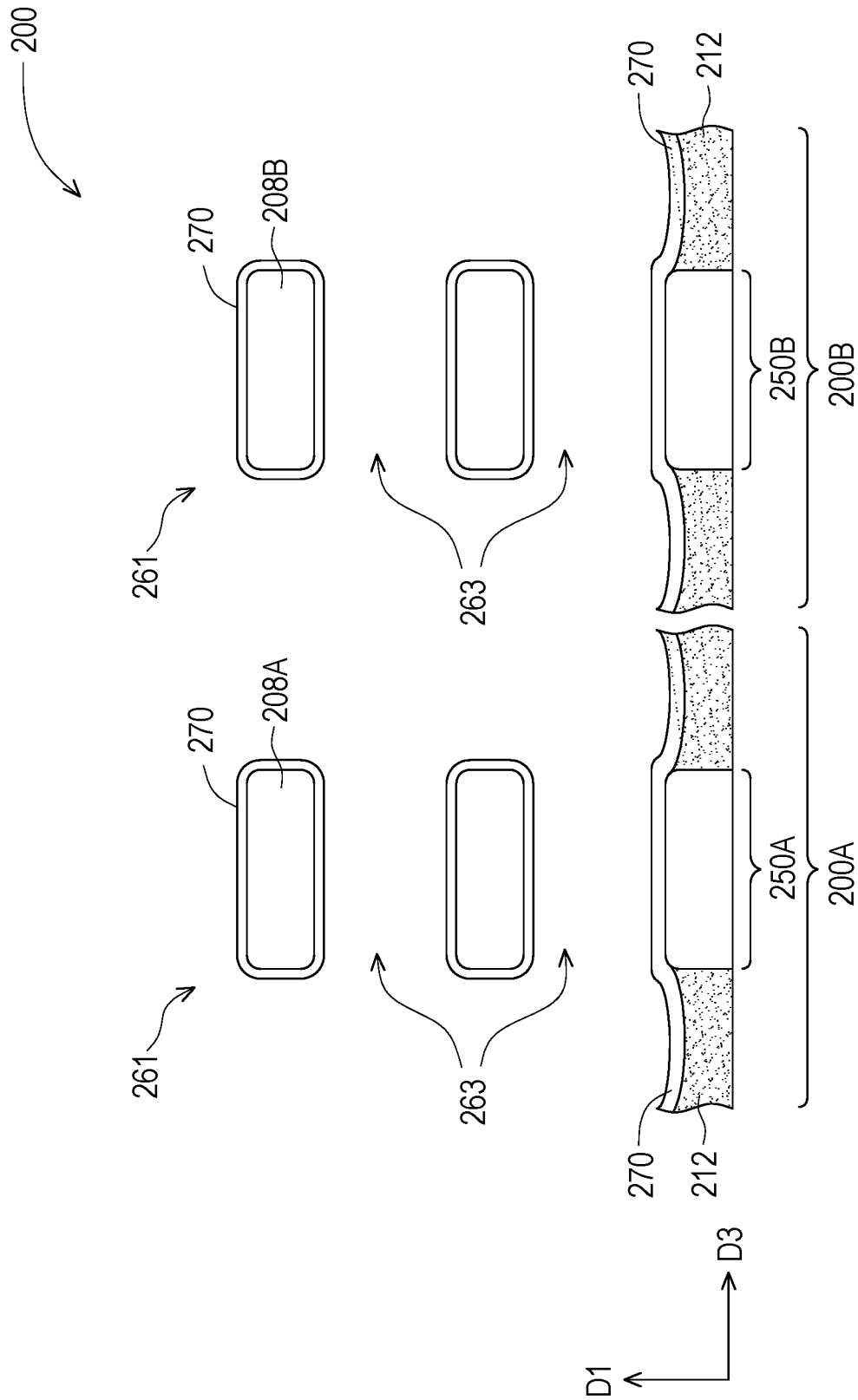

Referring to FIG. 1 and FIGS. 6-7 together, the method 100 includes a step 108 where first channel members 208A in the first channel region 250A are released and second channel members 208B in the second channel region 250A are released. FIG. 6 illustrates the plurality of alternating semiconductor layers 204 in the first channel region 250A and the second channel region 250B after the dummy gate electrode 218 is removed. FIG. 7 illustrates the removal of the dummy gate dielectric layer and the removal of the plurality of first semiconductor layers 206 in the first channel region 250A and the second channel region 250B. Referring to FIG. 6 and FIG. 7, gate trenches 261 are formed in the first channel region 250A and the second channel region 250B and expose the dummy gate dielectric layer 216, as a result of the removal of the dummy gate electrode 218. In some embodiments, the dummy gate dielectric layer 216 is then removed using a suitable etch process. The etch process for removing the dummy gate dielectric layer 216 is different from the one used to remove the dummy gate electrode 218. After the dummy gate dielectric layer 216 is removed, the plurality of first semiconductor layers 206 may be selectively removed. In one embodiment, the plurality of first semiconductor layers 206 are formed of silicon germanium and the selective removal process includes oxidizing the plurality of first semiconductor layers 206 using a suitable oxidizer, such as ozone.

Thereafter, the oxidized second semiconductor layers 206 may be selectively removed. At this point, as shown in FIG. 7, the first channel members 208A and the second channel members 208B are respectively formed in the first area 200A and the second area 200B, and may serve as the transistor channels for the respective transistor. The first channel members 208A and the second channel members 208B are suspended over the substrate and between the respective source/drain features, in accordance with some embodiments. Furthermore, the first channel members 208A and the second channel members 208B are separated from each other and from the substrate by gaps 263 existing there-between. In some embodiments, each of the first channel members 208A and the second channel members 208B has nanometer-sized dimensions. Thus, the first channel members 208A and the second channel members 208B are referred to as a "nanosheet," which generally refers to a channel layer suspended in a manner that will allow a metal gate to physically contact at least two sides of the channel layer, and in GAA transistors, will allow the metal gate to physically contact at least four sides of the channel layer (i.e., surround the channel layer). Alternatively, the first channel members 208A and the second channel members 208B may be cylindrical-shaped (e.g., nanowire), rectangular-shaped (e.g., nanobar), sheet-shaped (e.g., nanosheet), or have other suitable shapes. In some embodiments, a thickness (i.e., dimension in the first direction D1) of each of the first channel members 208A and the second channel members 208B ranges from about 8 nm to about 12 nm. For example, each of the first channel members 208A and the second channel members 208B may have a thickness about 5 nm.

Still referring to FIG. 1 and FIG. 7, the method 100 includes a step 110 where an interfacial layer 270 is formed over each of the first channel members 208A in the first channel region 250A and each of the second channel members 208B in the second channel region 250B after releasing the first channel members 208A and the second channel members 208B. In some embodiments, the interfacial layer 270 is formed conformally over the substrate and conformally covers exposed surfaces of the first channel members 208A and the second channel members 208B. In some embodiments, the interfacial layer 270 includes silicon oxide or silicon oxynitride, or other suitable material. The interfacial layer 270 may be deposited using a suitable method, such as atomic layer deposition (ALD), CVD, ozone oxidation, thermal oxidation, or other suitable method. In some embodiments, the interfacial layer 270 has a thickness in a range from about 1 nm to about 5 nm. For example, the thickness of the interfacial layer 270 is about 1 nm. The interfacial layer 270 may function to control and reduce gate leakage current and improve interfacial adhesion between later-formed gate dielectric layer and the channel members (i.e., the first channel members 208A and the second channel members 208B).

Figure 8:
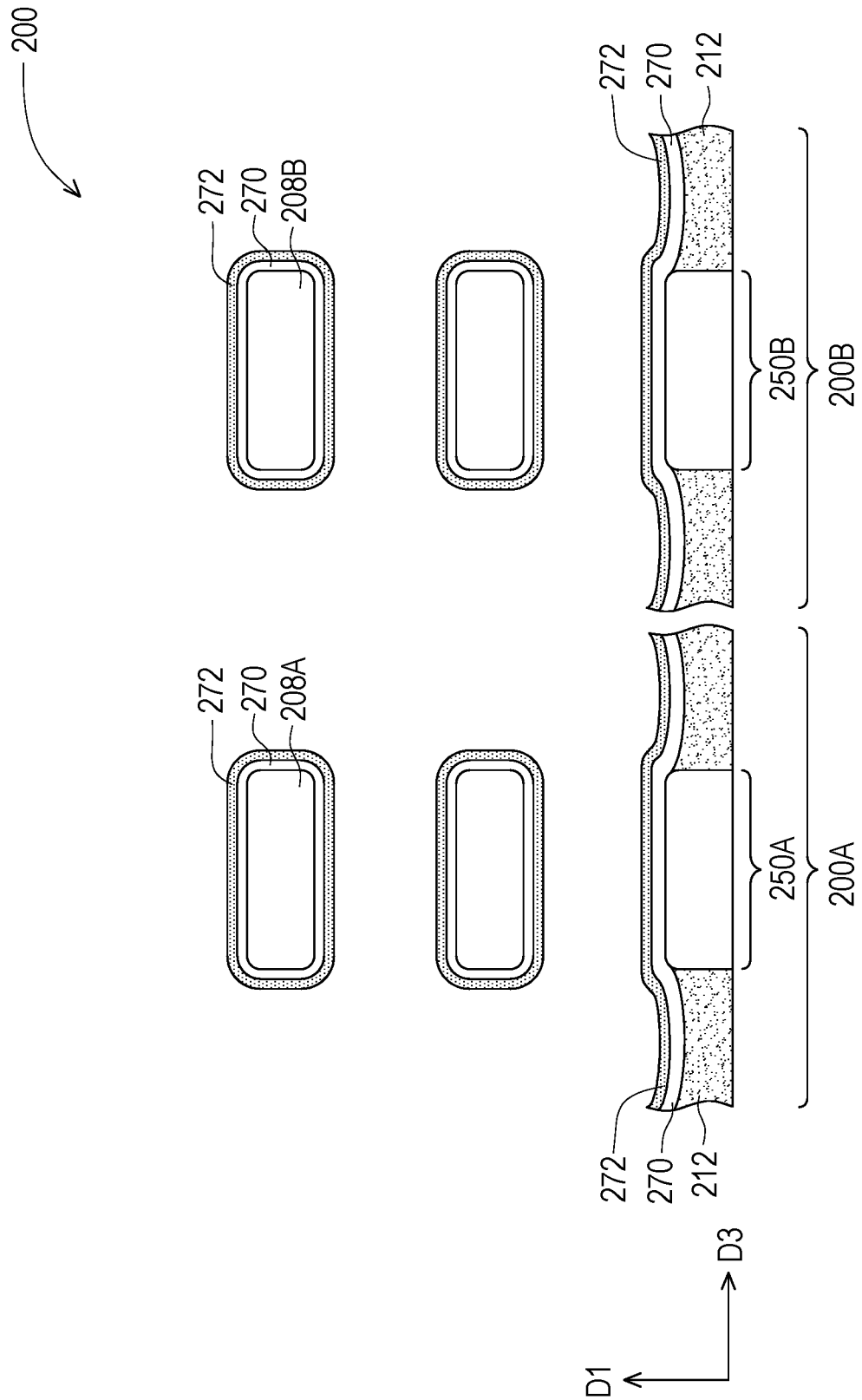

Referring to FIG. 1 and FIG. 8 together, the method 100 includes a step 112 where a gate dielectric layer 272 is deposited over the interfacial layer 270 in the first channel region 250A and the second channel region 250B. In some embodiments, the gate dielectric layer 272 is formed conformally over the substrate, and conformally covers the interfacial layer 270 wrapping around the first channel members 208A and the second channel members 208B. In some embodiments, the gate dielectric layer 272 includes a high-k dielectric layer (high-k dielectric as its dielectric constant is greater than that of silicon dioxide). In some embodiments, the gate dielectric layer 272 includes doped or undoped hafnium oxide ($HfO_2$), doped or undoped zirconium oxide ($ZrO_2$), doped or undoped titanium oxide ($TiO_2$), or doped or undoped aluminum oxide ($Al_2O_3$). For example, the gate dielectric layer 272 may include hafnium silicon oxide (HfSiO), hafnium silicon oxynitride (HfSiON), or hafnium aluminum oxide (HfAlO), hafnium tantalum oxide (HfTaO), hafnium zirconium oxide (HfZrO), zirconium silicon oxide ($ZrSiO_2$), hafnium titanium oxide (HfTiO), or a combination thereof. In some embodiments, the gate dielectric layer 272 has a thickness in a range from about 1 nm to about 3 nm. For example, the thickness of the gate dielectric layer 272 is about 1.5 nm. Upon conclusion of operation at step 112, each of the first channel members 208A and each of the second channel members 208B are sequentially wrapped around by the interfacial layer 270 and the gate dielectric layer 272.

Referring to FIG. 1 and FIGS. 9-11 together, the method 100 includes a step 114 where a dipole layer 274 is conformally deposited over the gate dielectric layer 272 in the first channel region 250A and the second channel region 250B through a cyclic deposition etch (CDE) process. Typically, the CDE process includes alternating deposition and etching cycles within the same processing chamber by alternating the reactant gases flowing into the processing chamber. For example, the process for forming the dipole layer 274 over the gate dielectric layer 272 may be performed in an ALD chamber. Other suitable chambers may also be used.

Figure 9:
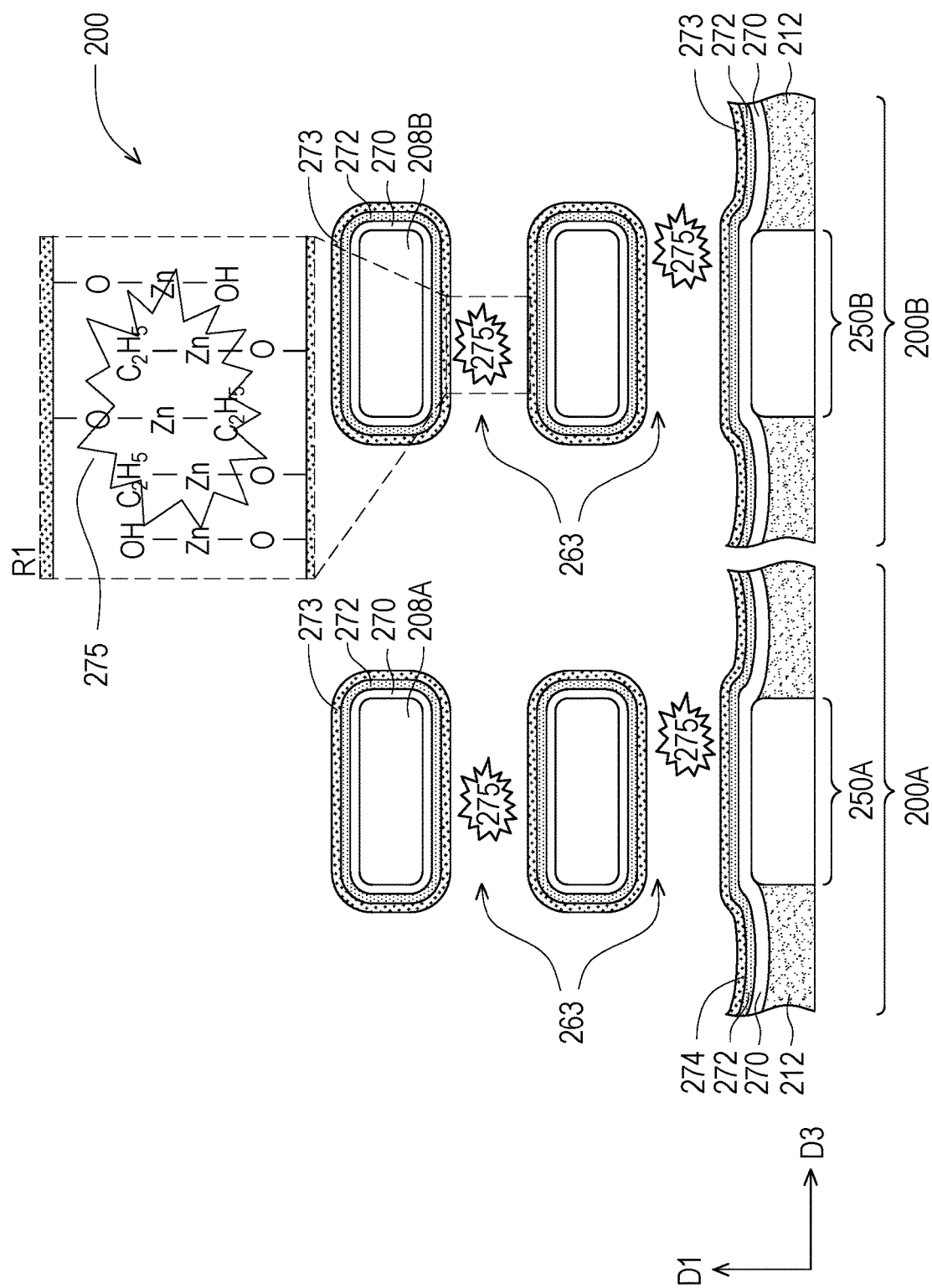

Referring to FIG. 9, in some embodiments, the dipole layer 274 is formed by firstly depositing a dipole material 273 on the exposed surfaces of the gate dielectric layer 272. In some embodiments, the dipole material 273 includes dipole metal elements for threshold voltage tuning. For example, depending on the electron affinity and oxygen atom density, the dipole material is either an n-dipole material or a p-dipole material. The p-dipole material generally serves to reduce the threshold voltage of a p-type transistor and to increase the threshold voltage of an n-type transistor, and the n-dipole material serves to reduce the threshold voltage of an n-type transistor and to increase the threshold voltage of a p-type transistor. According to the present disclosure, the dipole material 273 includes zinc ion ($Zn^{2+}$) as the dipole metal elements and the dipole material is zinc oxide (ZnO), which is a p-dipole material, and may be formed using an ALD process. In some embodiments, the formation of the dipole material 273 (i.e., ZnO) involves the reaction of diethylzinc (DEZn, $(C_2H_5)_2Zn$) and ozone ($O_3$) where DEZn is used as a precursor and ozone is used as an oxidizer.

An enlarged region "R1" depicted in the upper part of FIG. 9 shows an example region at the gap 263 in detail. As shown in the enlarged region "R1", incompletely dissociated DEZn may agglomerate near or at the deposited surface of the dipole material 273 in the corresponding gap 263 between two adjacent first channel members 208A or second channel members 208B as the agglomeration of incompletely dissociated DEZn tends to occur in such small space. For ease of illustration, the agglomerate is labeled 275 in FIG. 9. A space between the two adjacent first channel members 208A or second channel members 208B may be referred to as a sheet-sheet spacing, and the sheet-sheet spacing determines the size of the gap(s) 263. In some embodiments, a height of the sheet-sheet spacing is in a range from about 3.5 nm to about 4.5 nm. Possible agglomeration of incompletely dissociated DEZn occurred in the gaps 263 may cause non-uniform formation of the dipole layer and the thickness of the dipole layer may be varied.

Figure 10:
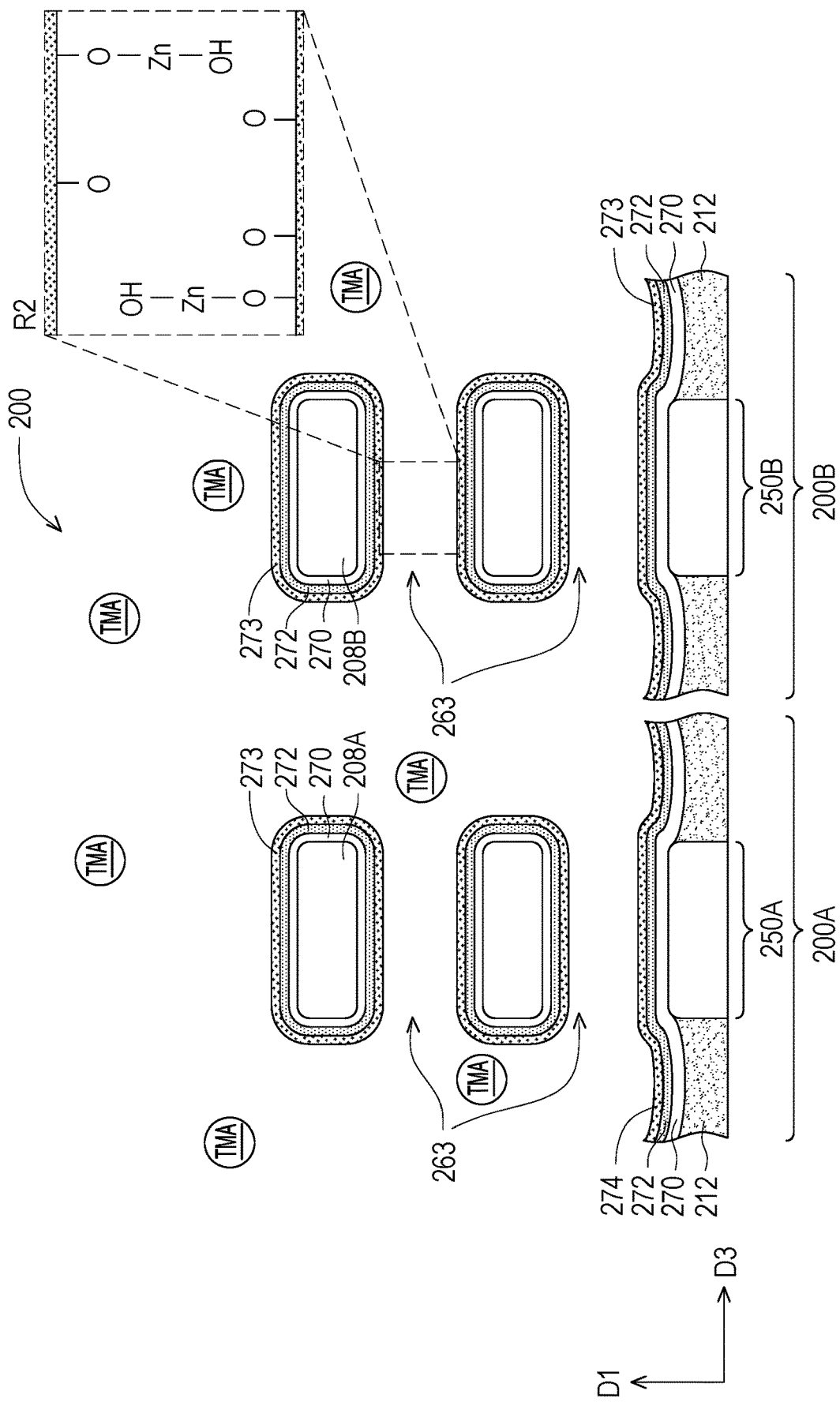

Referring to FIG. 10, upon the deposition of the dipole material 273, the structure 200 is also exposed to an auxiliary reactant gas in the same chamber for assisting the uniform formation of the dipole layer 274. In some embodiments, the auxiliary reactant gas includes trimethylaluminum (TMA, $Al(CH_3)_3$). In some embodiments, TMA may be used as an "etchant" for the removal of the agglomerates 275 of incompletely dissociated DEZn. In some embodiments, TMA has a higher reactivity (e.g., requires less energy to react) with ethyl-terminated ZnO (i.e., incompletely dissociated DEZn) than hydroxyl-terminated ZnO (i.e., completely dissociated DEZn). That is, TMA is more likely to react with ethyl-terminated ZnO, which can remove the ethyl-terminated ZnO from the deposition surface of the dipole material 273 and form aluminum oxide ($Al_2O_3$) on the deposition surface of the dipole material 273. In some embodiments, the reaction between TMA and ethyl-terminated ZnO is spontaneous and may be reacted at a temperature about 150° C. The reaction mentioned above may also be referred to as an etch reaction since ethyl-terminated ZnO is removed after the reaction. As shown in an enlarged region "R2" depicted in FIG. 10, a plurality of vacancies is formed at the sites originally occupied by the agglomerates 275 after the etch reaction.

Figure 11:
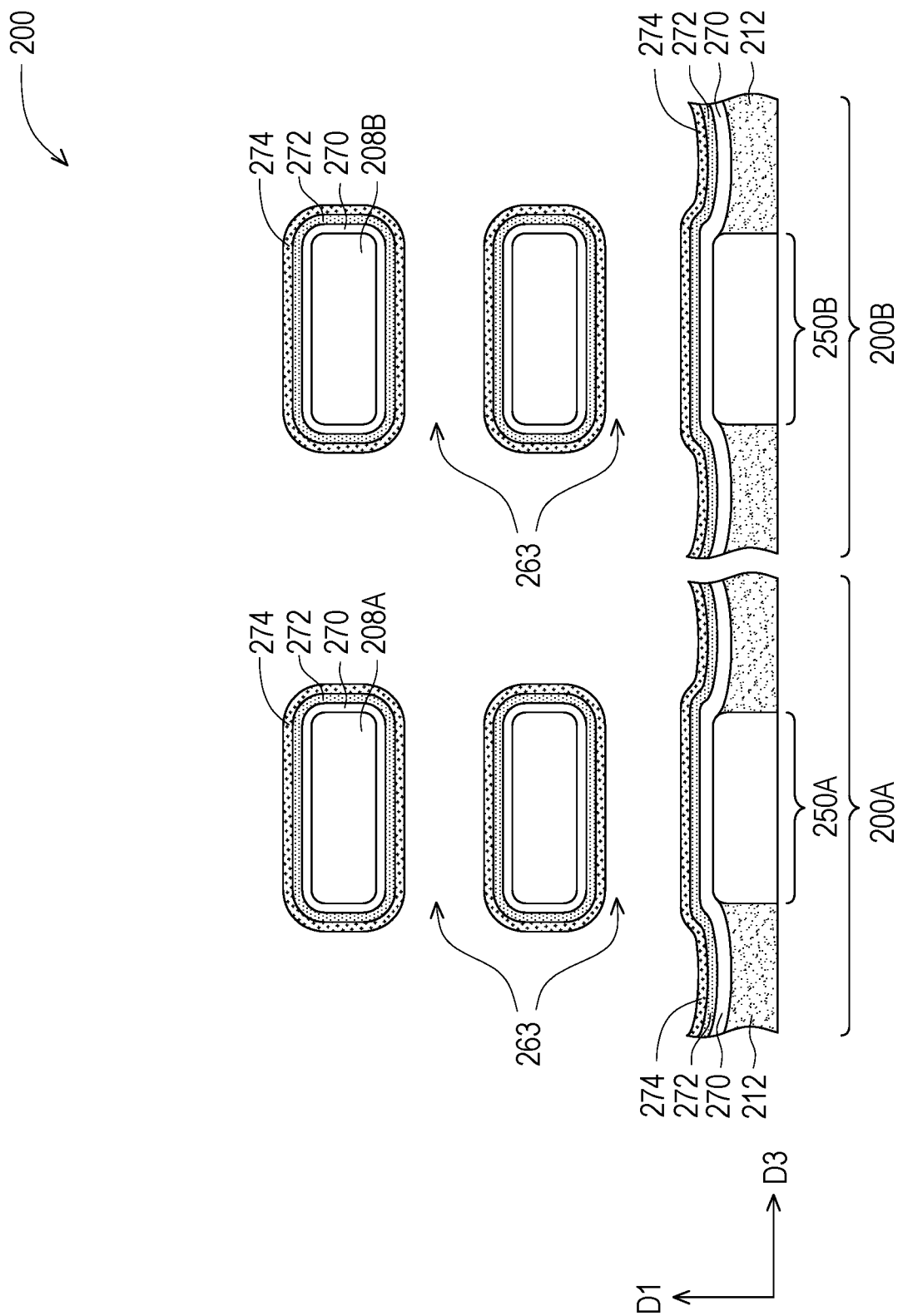

Thereafter, the process steps of deposition of the dipole material 273 (e.g., deposition phase) as depicted in FIG. 9 and the removal of the agglomerates 275 (e.g., etching phase) as depicted in FIG. 10 may be performed as a cycle and repeated multiple times to form the dipole layer 274. For example, the deposition/etch cycle may be repeated 5 to 10 times. By using the CDE process to form the dipole layer 274, the agglomeration of incompletely dissociated DEZn can be minimized and the as-formed dipole layer 274 can have a substantially uniform thickness and a substantially even and flat surface. In some embodiments, the thickness of the dipole layer 274 is in a range from about 1 nm to about 3 nm. As illustrated in FIG. 11, the dipole layer 274 formed on each of the first channel members 208A or on each of the second channel members 208B has a substantially uniform thickness, and the dipole layers on adjacent channel members are unattached and spaced apart from each other without the agglomerate after the CDE process. In some embodiments, the uniform thickness of the dipole layer 274 ensures uniform diffusion of the dipole metal elements and uniform distribution of the diffused metal elements. As the diffused dipole metal elements results in the formation of the interfacial dipole surface, which changes the threshold voltage, the uniform distribution of the dipole metal elements leads to minimal variation of the threshold voltage. In some embodiments, the dipole layer 274 includes mainly zinc oxide (ZnO). Further, in some embodiments, the dipole layer 274 includes a mixture of ZnO and $Al_2O_3$, as $Al_2O_3$ may be in-situ formed during etch phases of the CDE cycles.

Figure 12:
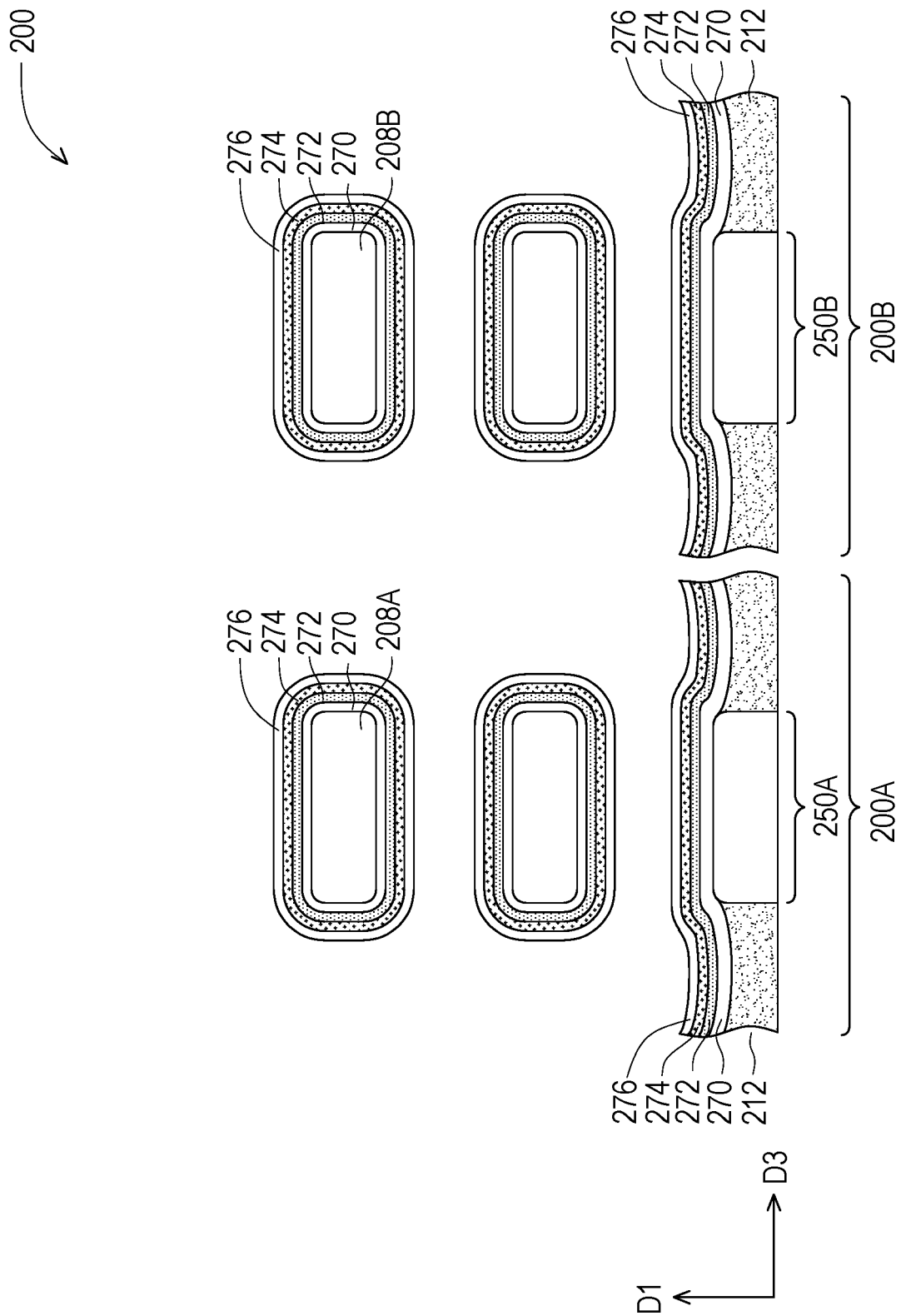

Referring to FIG. 1 and FIG. 12 together, the method 100 includes a step 116 where a capping layer 276 is deposited over the dipole layer 274 in the first channel region 250A and the second channel region 250B. In some embodiments, the capping layer 276 is used for preventing the diffusion of dipole metal elements (e.g., $Zn^{2+}$) out of the dipole layer 274 during the subsequent thermal drive-in process. In some certain embodiments, the capping layer 276 includes aluminum oxide (e.g. $Al_2O_3$). The capping layer 276 may be formed using a suitable deposition process, such as ALD process. In some other embodiments, the formation of the capping layer 276 may be omitted from the structure 200, and thus the step 116 may be omitted from the method 100. That is because the in-situ formed aluminum oxide during the CDE process can function as a cap, and the formation of the capping layer 276 may be omitted.

Figure 13:
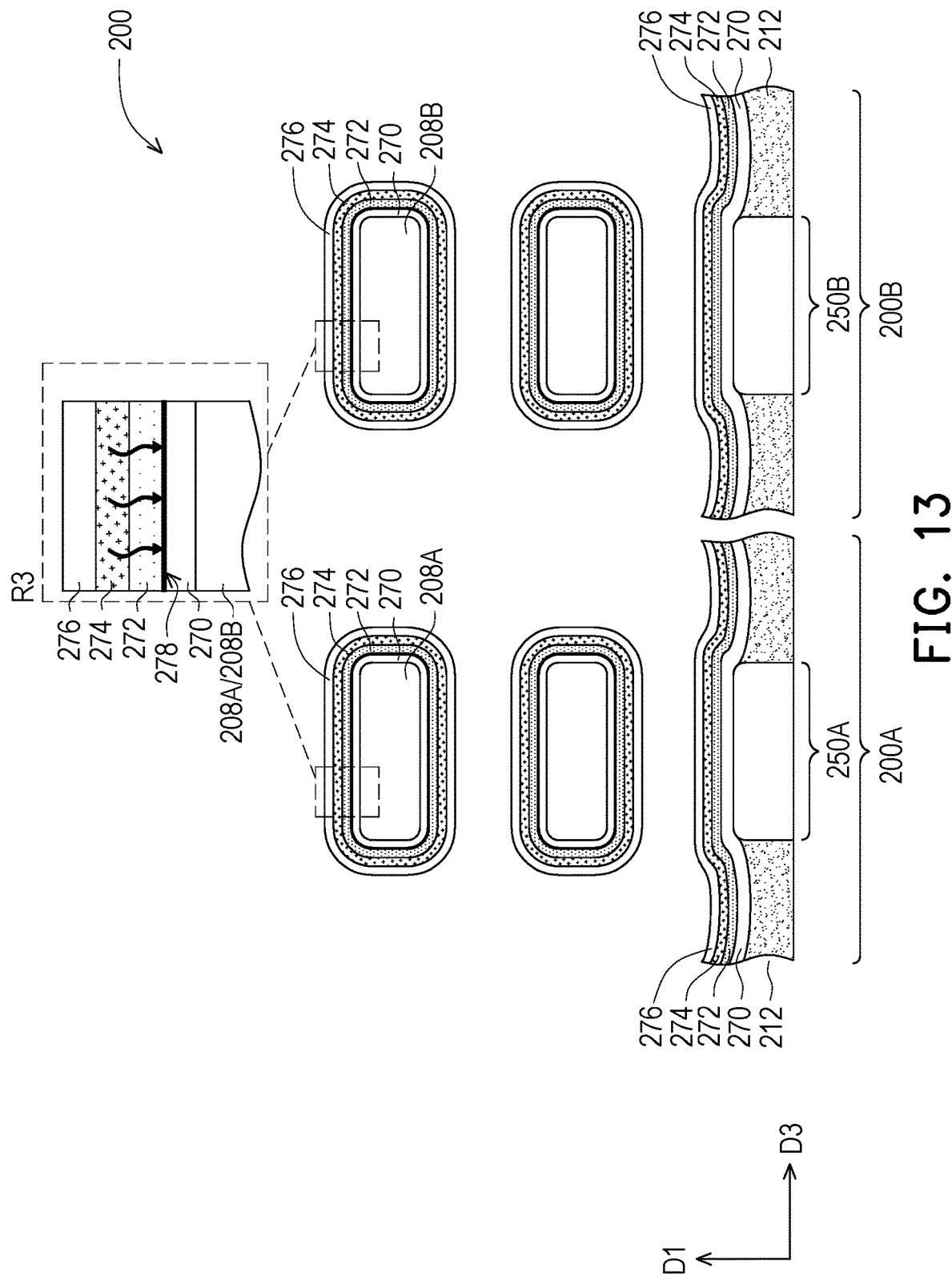

Referring to FIG. 1 and FIG. 13 together, the method 100 includes a step 118 where a thermal drive-in process is performed so that dipole metal elements from the dipole layer 274 are diffused out and driven into the gate dielectric layer 272. In some embodiments, the thermal drive-in process includes an annealing process, such as rapid thermal annealing (RTA), millisecond annealing (MSA), microsecond annealing (OA), or other suitable annealing processes. For example, the annealing temperature is controlled to be in a range from about 500° C. to about 750° C., and the annealing time may be between about 30 seconds and about 60 seconds. The temperature is selected such that it does not adversely affect the existing structures and features of the structure 200 and is yet sufficient to cause the dipole metal elements to migrate (or diffuse) from the dipole layer 274 into the gate dielectric layer 272 thereunder, as indicated by arrow in an enlarged region "R3" depicted in FIG. 13. In addition, the temperature is selected to selectively diffuse the dipole element (e.g., $Zn^{2+}$) without diffusing other elements of the dipole layer 274 (e.g., of in-situ formed $Al_2O_3$). Thus, the thermal drive-in process may also be referred to as a selectively drive-in process. In some embodiments, the dipole metal elements diffused out of the dipole layer 274 effectively pass through at least a majority of the gate dielectric layer 272. In some embodiments, the dipole metal elements diffused out of the dipole layer 274 effectively pass through the gate dielectric layer 272 and accumulate at an interface between the gate dielectric layer 272 and the interfacial layer 270. In other words, the dipole metal elements may diffuse into the interface between the gate dielectric layer 272 and interfacial layer 270 to form an interfacial dipole surface or layer 278. In some embodiments, the existence of the interfacial dipole layer 278 adjusts the threshold voltage of the transistor. In some embodiments, the uniform distribution of the diffused metal elements at the interface between the gate dielectric layer 272 and the interfacial layer 270 leads to the uniform interfacial dipole layer 278. Hence, the variation of the threshold voltage is minimized and the performance of the device in improved.

Figure 14:
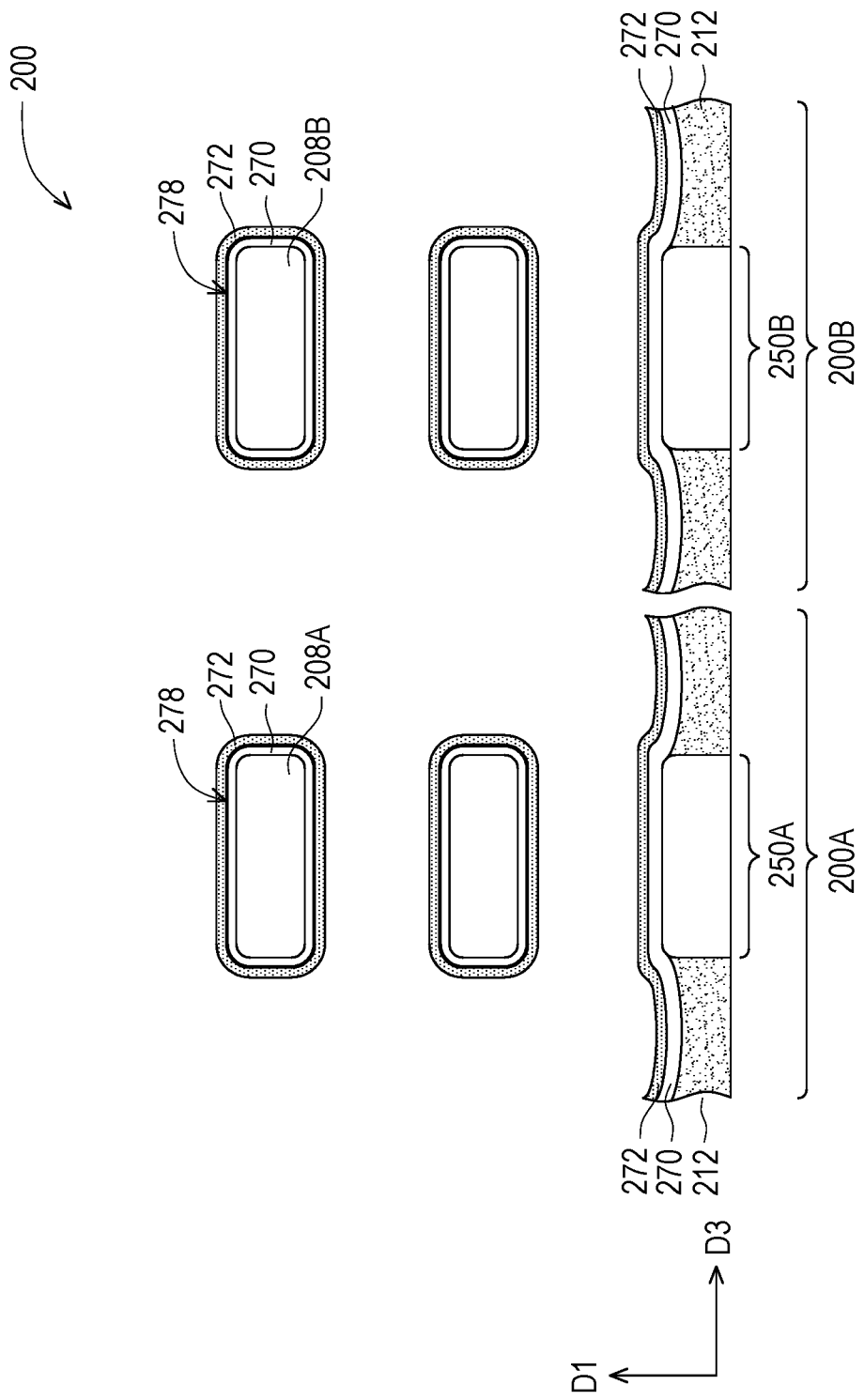

Referring to FIG. 1 and FIG. 14 together, the method 100 includes a step 120 where the dipole layer 274 and the capping layer 276 (if used) are selectively removed from the structure 200 by applying one or more etch processes. The resultant structure is shown in FIG. 14. In some embodiment, the etch process(es) includes a dry etch process, a wet etch process, a reactive ion etch (RIE) process, or a combination thereof. In some embodiments, the etch process(es) has a high etching selectivity with respect to the dipole layer 274 and the capping layer 276 relative to the gate dielectric layer 272, so that the dipole layer 274 and the capping layer 276 are removed without damaging the gate dielectric layer 272.

Figure 15:
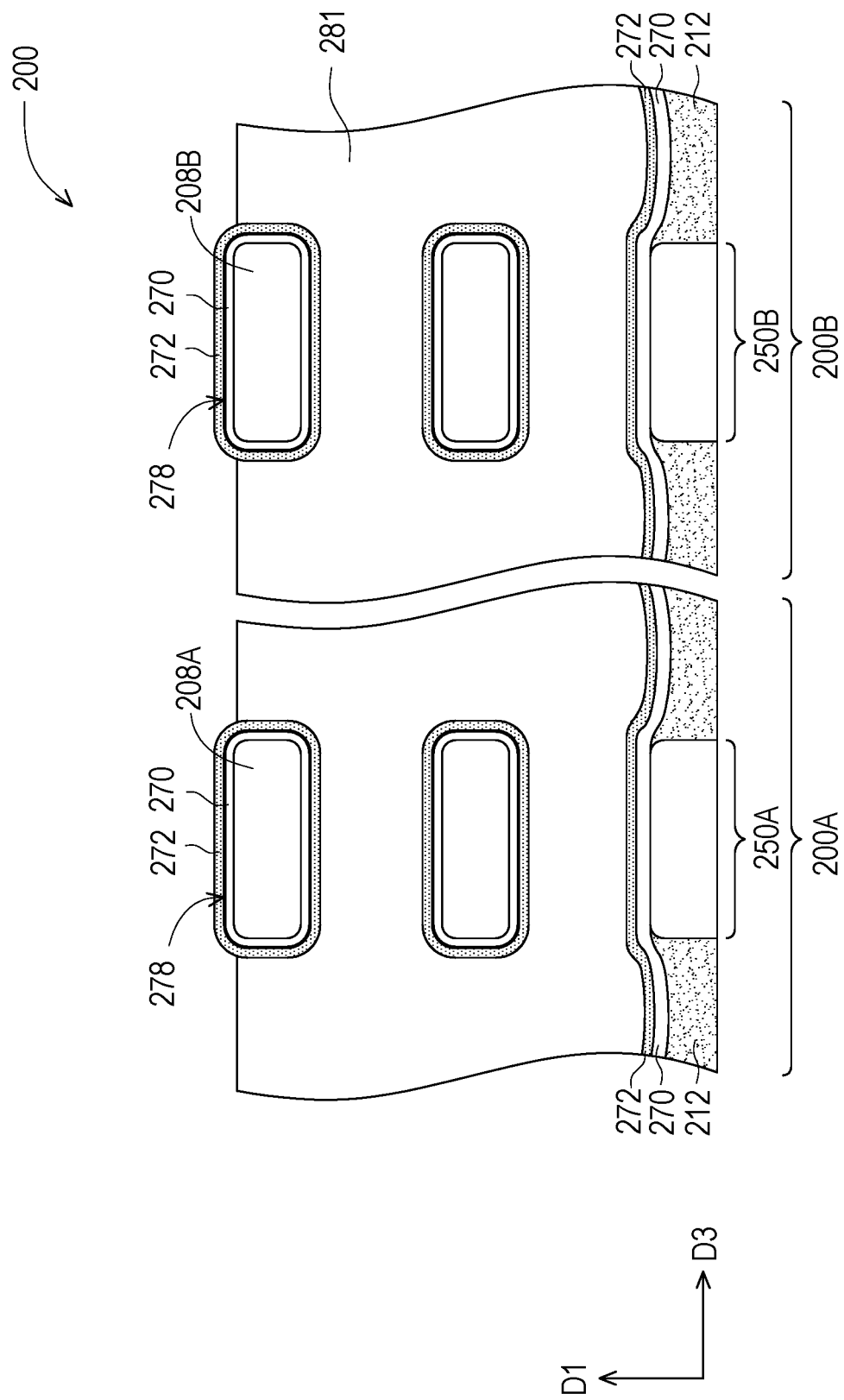

Referring to FIG. 1 and FIGS. 15-20 together, the method 100 includes a step 122 where one or more work function metal layers are sequentially formed surrounding the first channel members 208A in the first area 200A of the structure 200. In FIG. 15, a sacrificial material 281 is deposited to fill the gate trenches 261 and the gaps 263 (see FIG. 7). In some embodiments, the sacrificial material 281 is formed of a material that may be selectively removed without substantially damaging the gate dielectric layer 272. In one embodiment, the material of the sacrificial material 281 is aluminum oxide ($Al_2O_3$). The sacrificial material 281 may be deposited using a suitable deposition process such as CVD or ALD process. Next, a portion of the sacrificial material 281 may be recessed using an etch-back process such that the gate electric layers 272 of the topmost first channel member 208A and the topmost first channel member 208B are exposed. The resultant structure is shown in FIG. 15.

Figure 16:
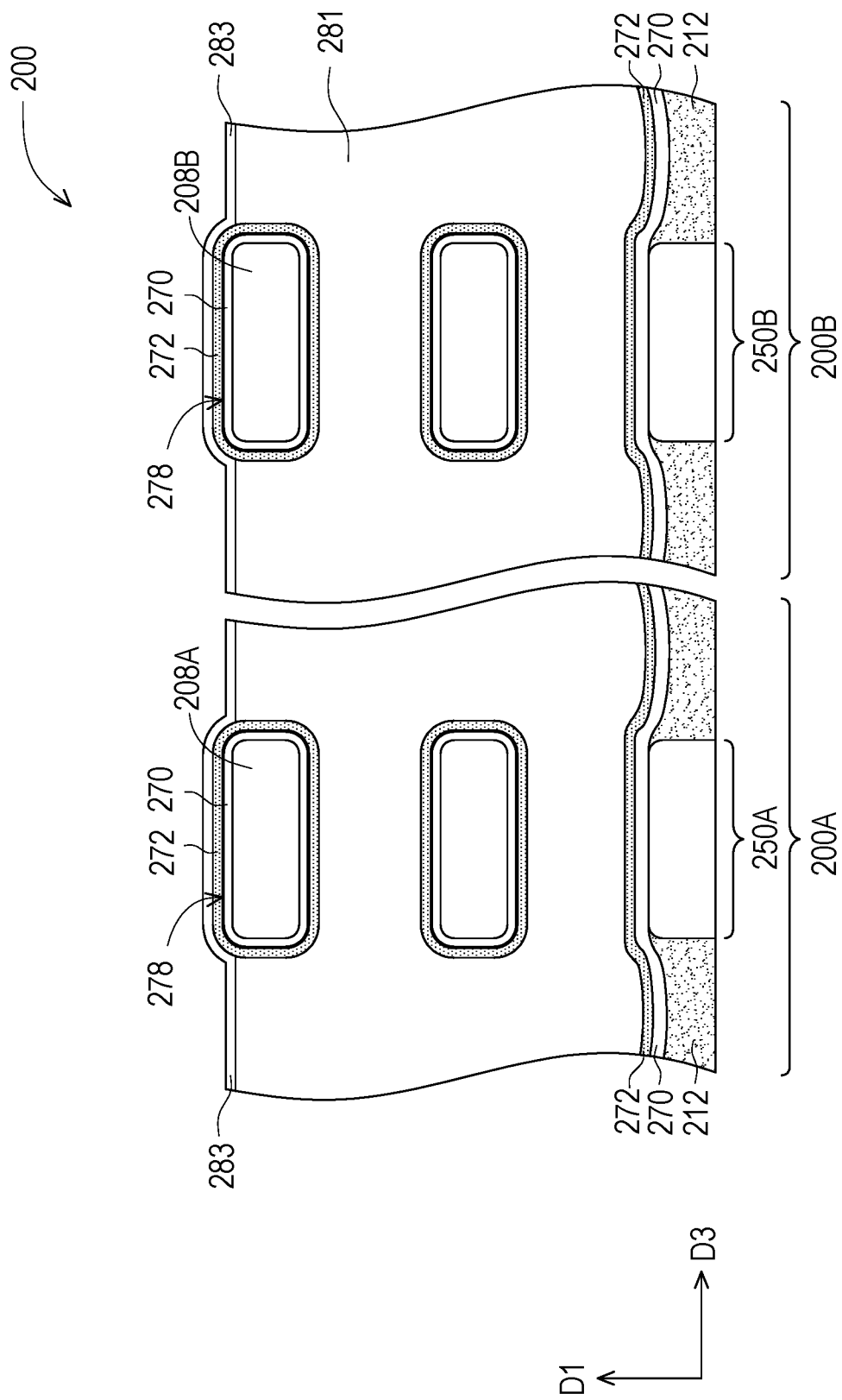

Referring to FIG. 16, a hard mask layer 283 is blanketly deposited on exposed surface of the remaining sacrificial material 281 in the first area 200A and the second area 200B. For example, the hard mask layer 283 is deposited with a substantially conformal profile covering the remaining sacrificial material 281 and the gate electric layers 272 of the topmost first channel member 208A and the topmost first channel member 208B. In some embodiments, the hard mask layer 283 is formed of titanium nitride (TiN) using a suitable deposition process, such as ALD process, and the hard mask layer 283 can act as an etching stop layer.

Figure 17:
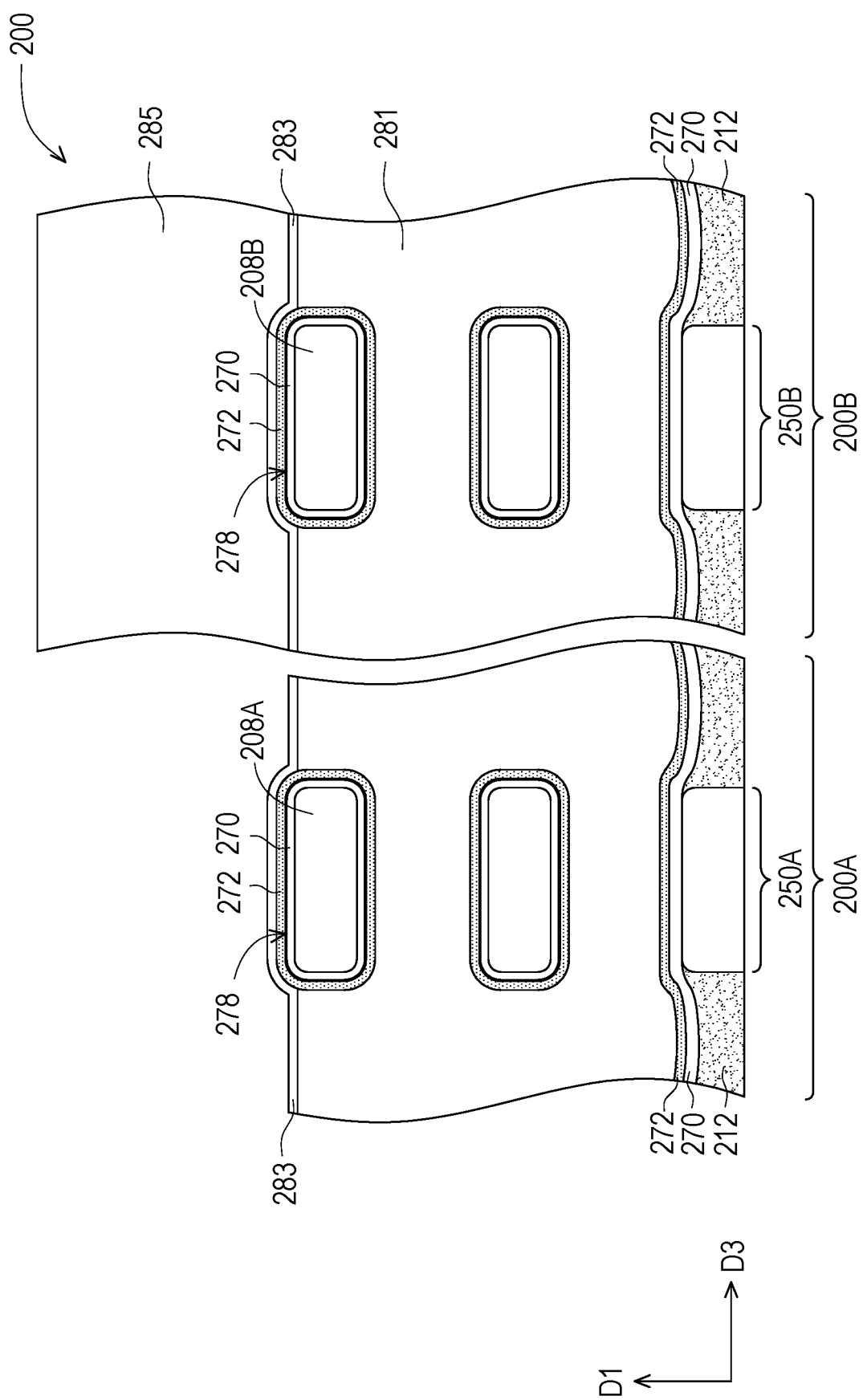
Figure 18:
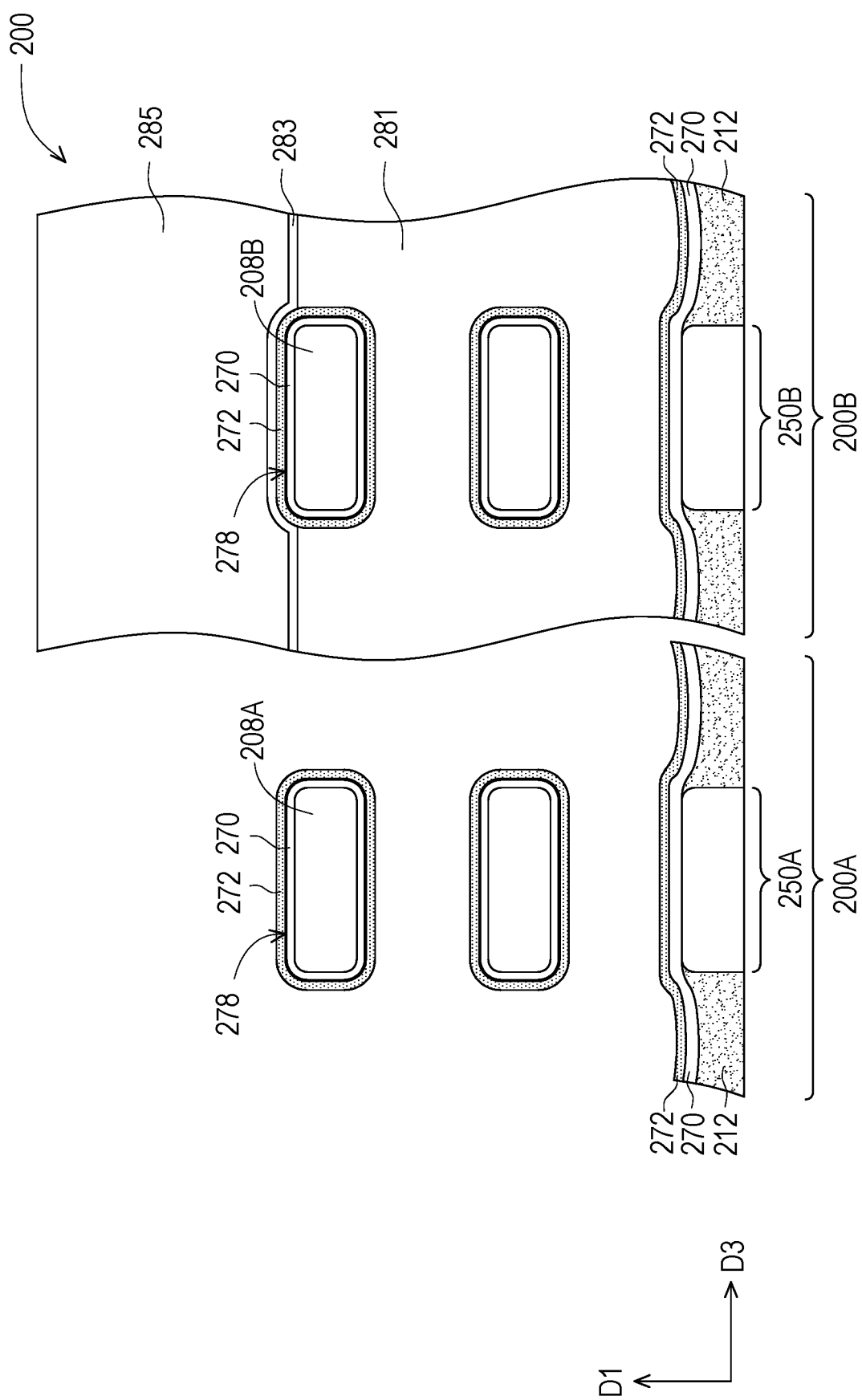
Figure 19:
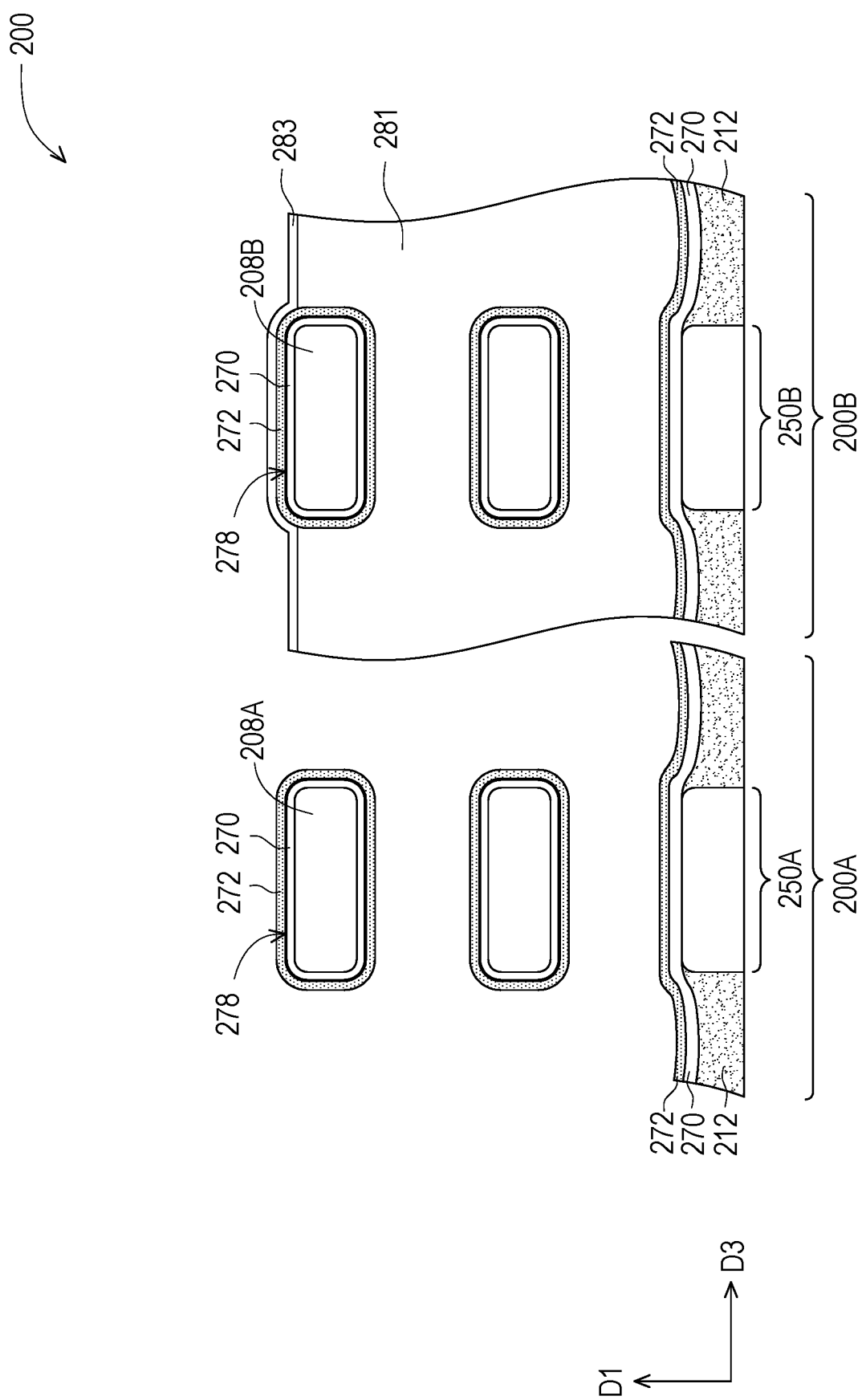

Referring to FIG. 17, a first mask layer 285 is formed over the second area 200B to cover the hard mask layer 283 over the second channel members 208B while the hard mask layer 283 in the first area 200A is exposed. In some embodiments, the first mask layer 285 is a photoresist layer, such as a bottom antireflective coating (BARC) layer. Thereafter, the exposed hard mask layer 283 in the first area 200A and the underlying sacrificial material 281 are removed using one or more etch processes, such that the gate dielectric layers 272 wrapping around the first channel members 208A are substantially exposed in the first area 200A, as illustrated in FIG. 18. After the gate dielectric layers 272 are exposed in the first area 200A, the first mask layer 285 is removed by ashing or a suitable technique. The resultant structure is shown in FIG. 19.

Figure 20:
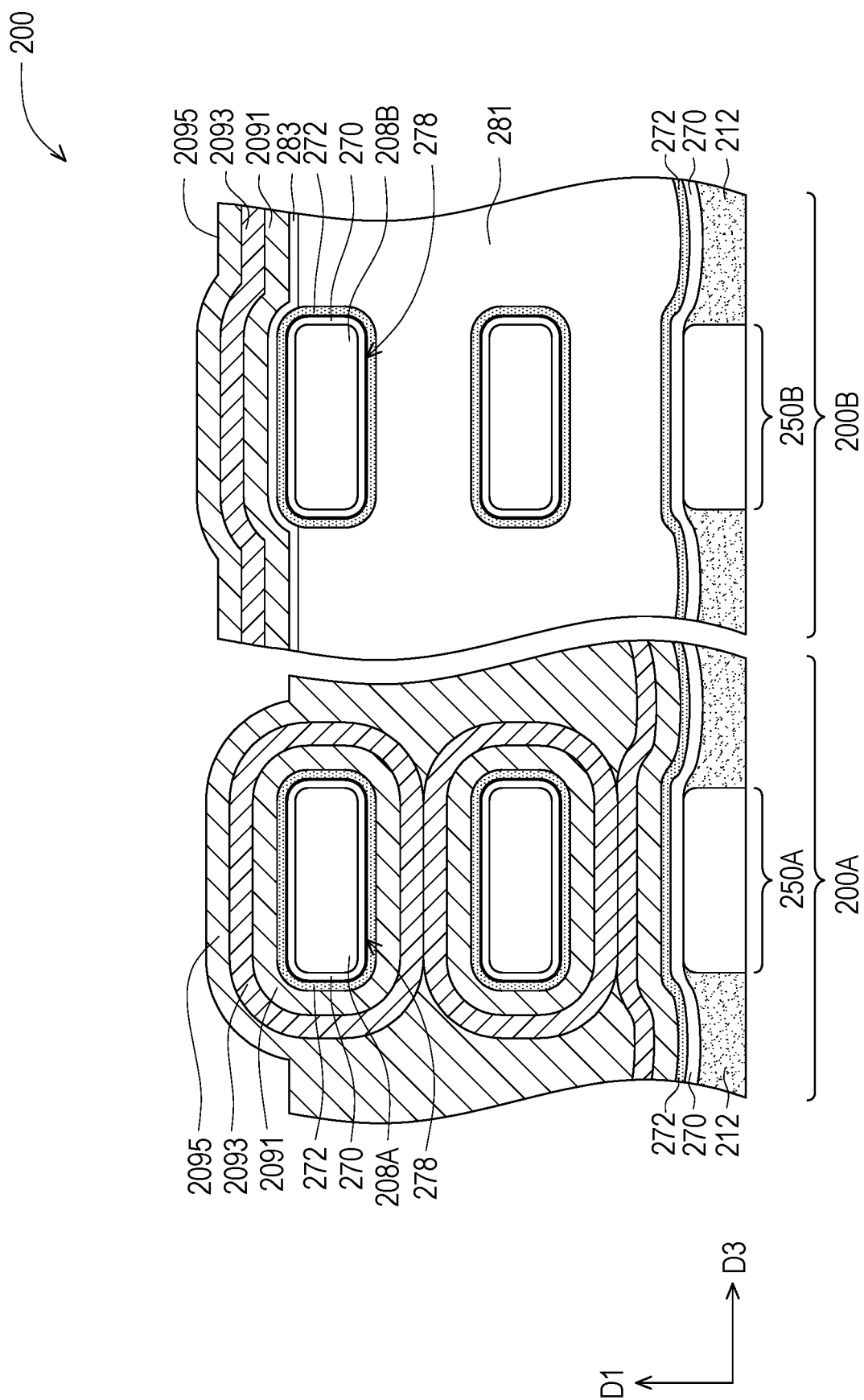

Turning to FIG. 20, a first work function metal layer 2901 is deposited on exposed surfaces in the first area 200A and the second area 200B. For example, the first work function metal layer 2901 in the first area 200A wraps around the first channel members 208A and is in direct contact with the gate dielectric layer 272, and the first work function metal layer 2901 in the second area 200B covers the hard mask layer 283. A second work function metal layer 2902 is then deposited over the first work function metal layer 2901 in the first area 200A and the second area 200B. For example, the second work function metal layer 2902 in the first area 200A wraps around the first work function metal layer 2901, and the second work function metal layer 2902 in the second area 200B is blanketly over the first work function metal layer 2901. As illustrated in FIG. 20, the second work function metal layers 2902 of neighboring first channel members 208A may contact to each other. Alternatively, the second work function metal layers 2902 of neighboring first channel members 208A may be separated form each other.

After the second work function metal layer 2902 is formed, a third work function metal layer 2903 is deposited to fill the remaining space of the gate trench in the first area 200A and to blanketly cover the second work function metal layer 2902 in the second area 200B. In some embodiments, the first work function metal layer 2901, the second work function metal layer 2902, and the third work function metal layer 2903 are formed of the same or different types (e.g., n-type or p-type) work function material(s), and may be formed using the same or different deposition process(es). In certain embodiments, the first work function metal layer 2901 and the second work function metal layer 2902 are formed of titanium nitride (TiN) using an ALD process, and the third work function metal layer 2903 is formed of TiN using a PVD process. In some other embodiments, treatment steps may be performed on the first work function metal layer 2901, the second work function metal layer 2902, and/or the third work function metal layer 2903, such as a thermal treatment or a plasma treatment, to provide a different work function value for each work function metal layer.

Although embodiments herein are illustrated with three layers of work function metal layers which include substantially the same material, the number of the work function metal layers and the materials thereof can be adjusted according to the design requirements of the semiconductor device.

Figure 21:
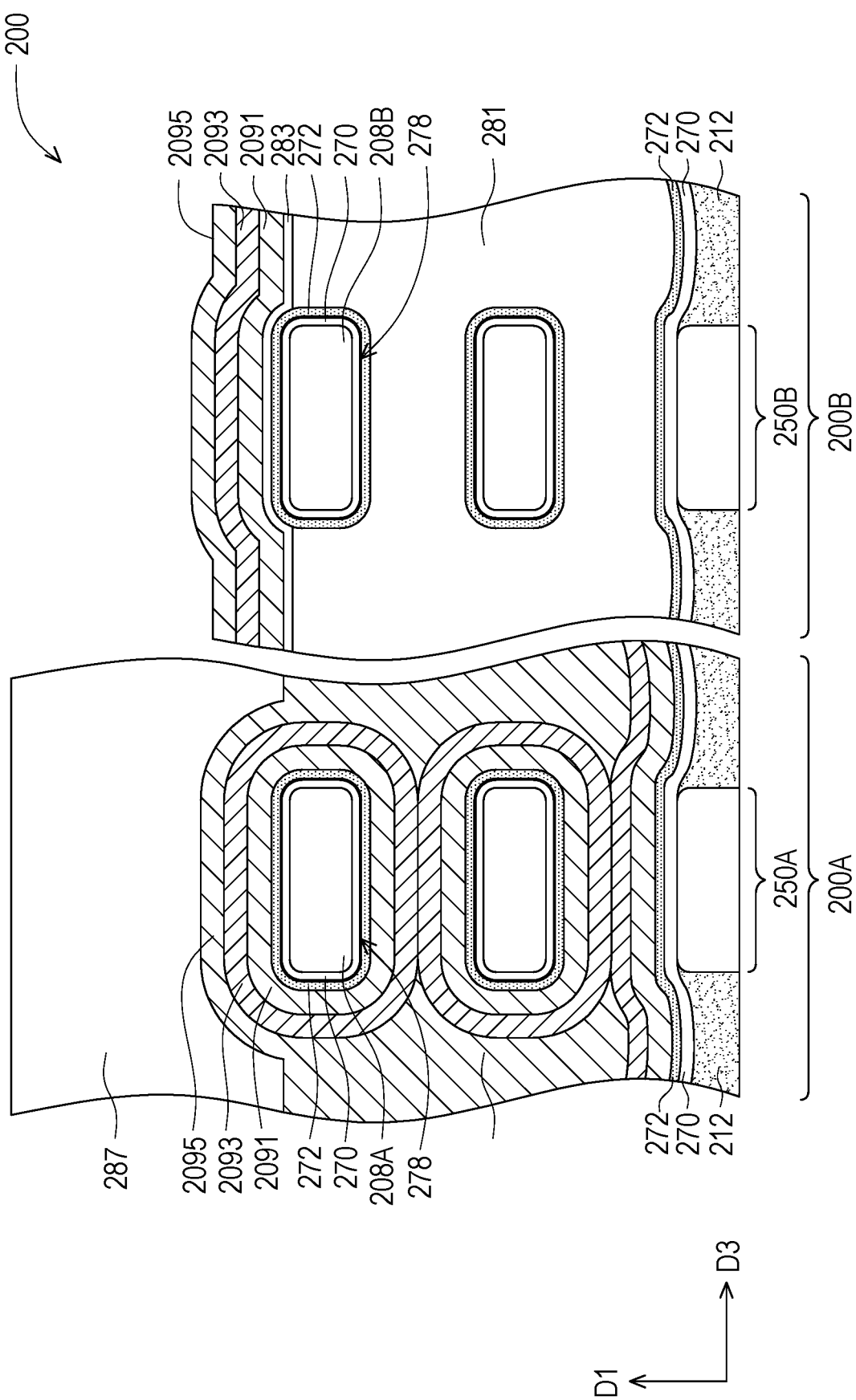
Figure 22:
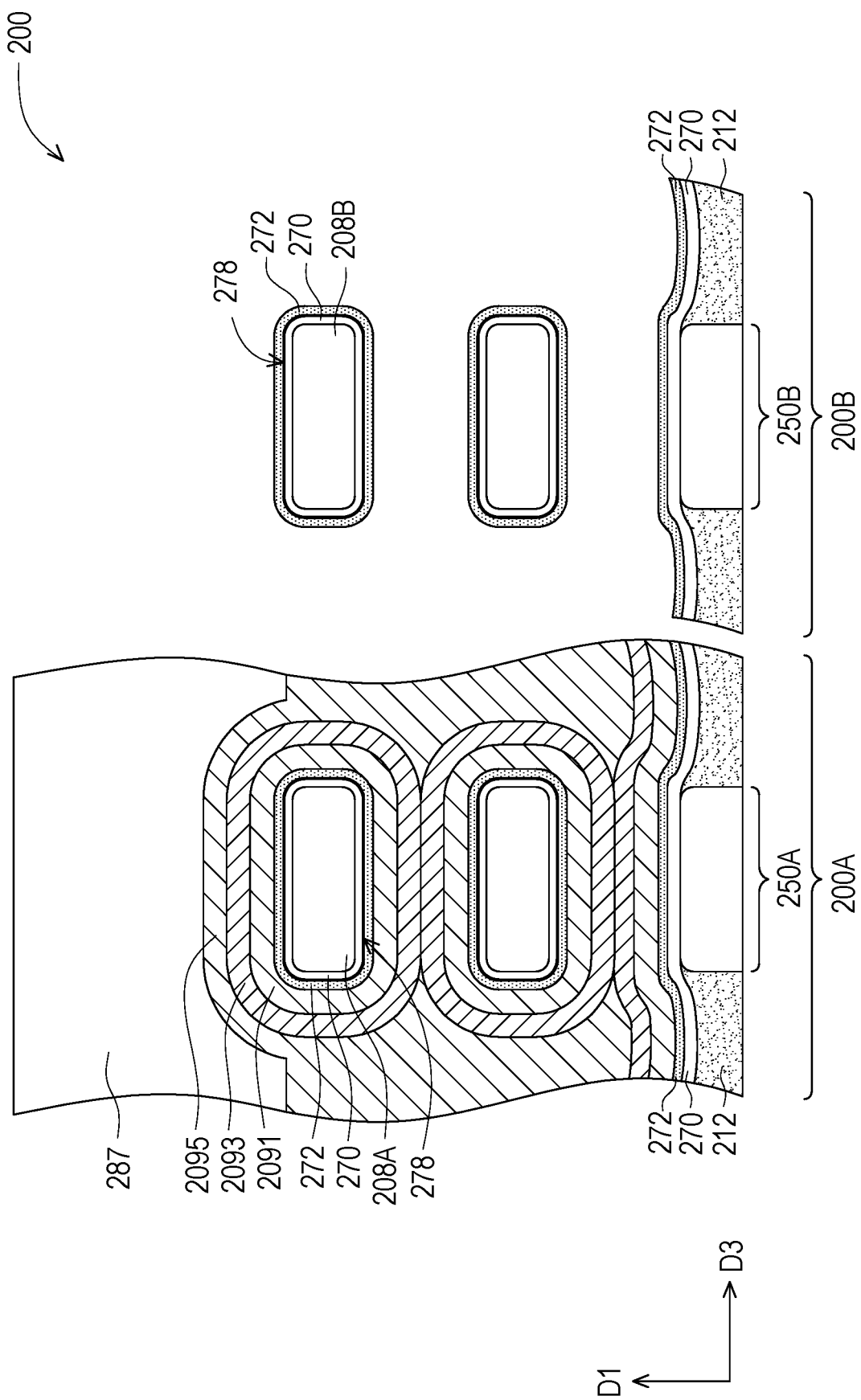
Figure 23:
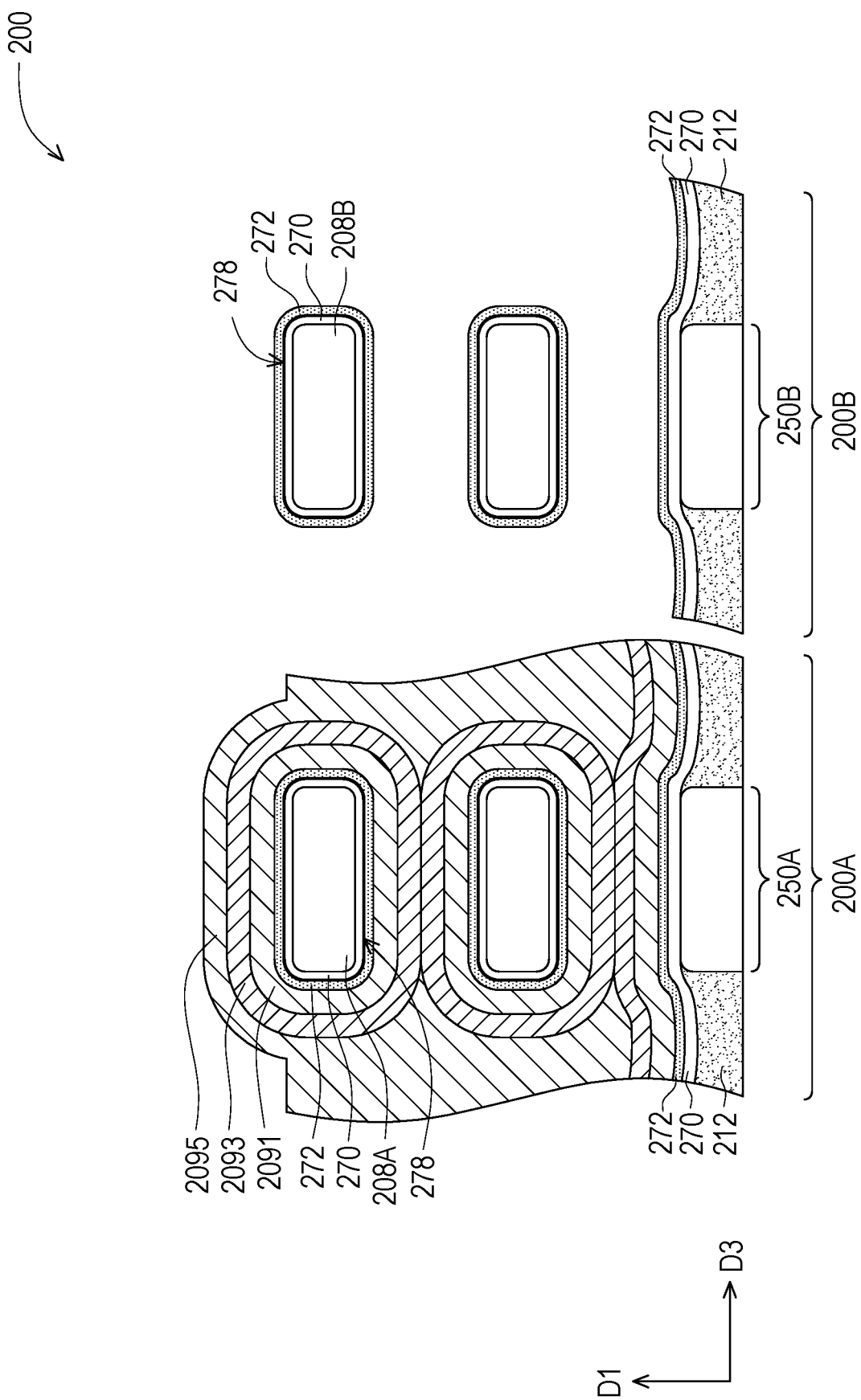

Referring to FIG. 1 and FIGS. 21-25 together, the method 100 includes a step 124 where a fourth work function metal layer 292 is formed in the first area 200A and the second area 200A of the structure 200. In FIG. 21, a second mask layer 287 is formed over the first area 200A to cover the third work function metal layer 2903 while the third work function metal layer 2903 in the second area 200B is exposed. In some embodiments, the second mask layer 287 is a photoresist layer, such as a BARC layer. Thereafter, the work function metal layers 2901, 2902, 2903, the hard mask layer 283, and the sacrificial material 281 in the second area 200B are removed using one or more etch processes, such that the gate dielectric layers 272 wrapping around the second channel members 208B are substantially exposed in the second area 200B, as illustrated in FIG. 22. After the gate dielectric layers 272 are exposed in the second area 200B, the second mask layer 287 is removed by ashing or a suitable technique. The resultant structure is shown in FIG. 23.

Figure 24:
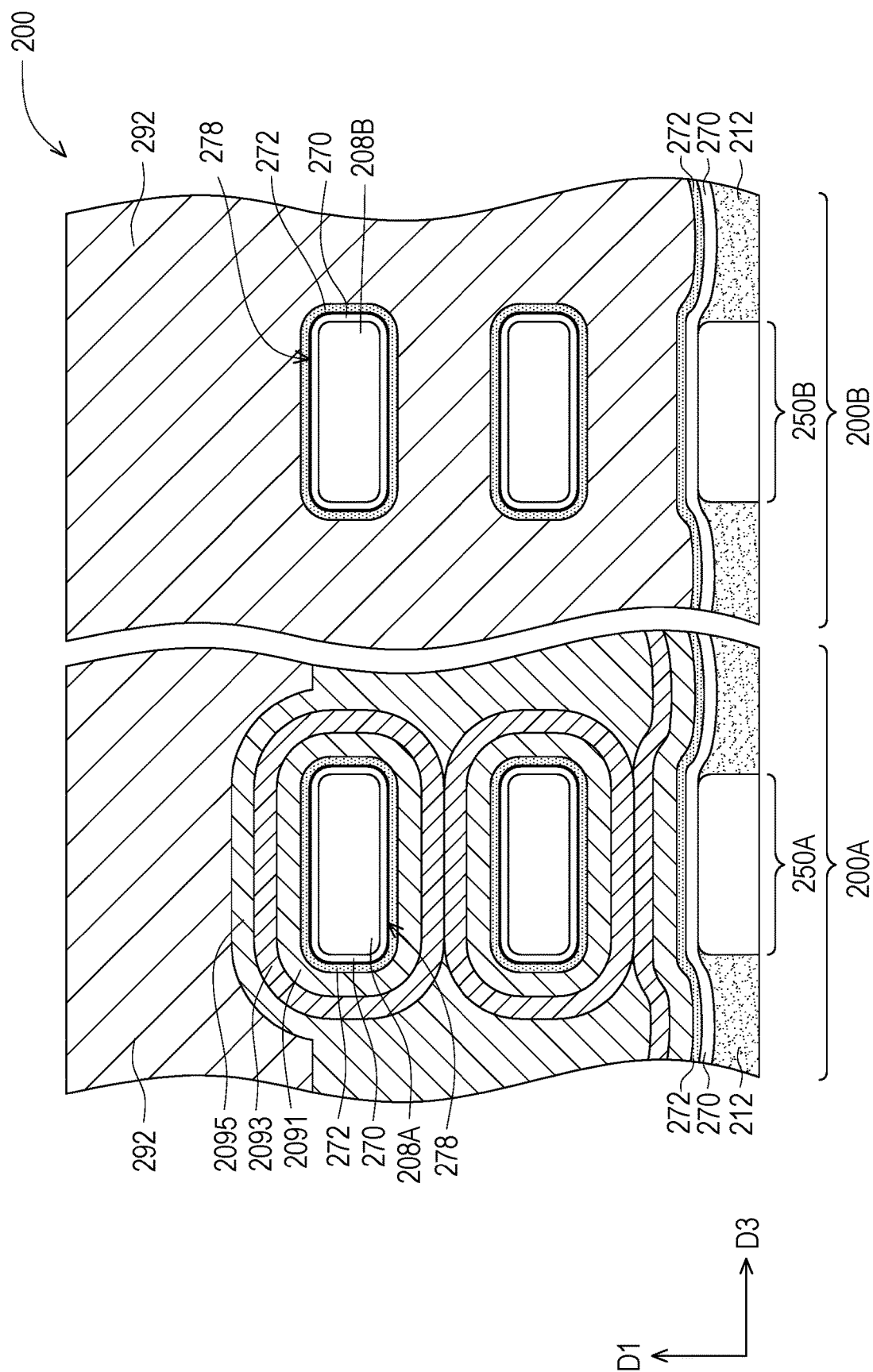
Figure 25:
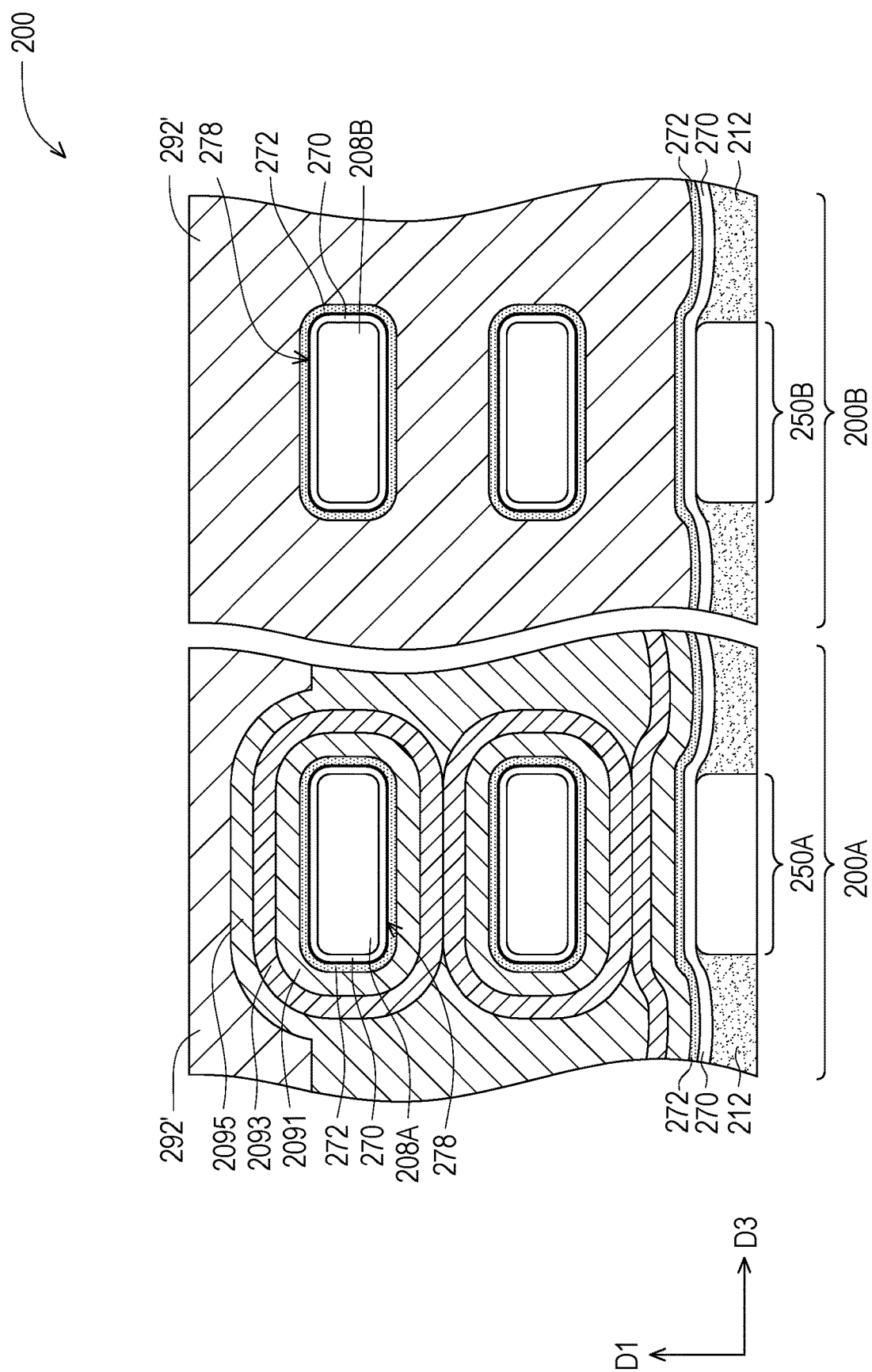

Turning to FIG. 24, the fourth work function metal layer 292 is deposited over the structure shown in FIG. 23. For example, the fourth work function metal layer 292 covers the third work function metal layer 2903 in the first area 200A and fills the space of gate trench in the second area 200B. The fourth work function metal layer 292 formed in the second area 200B surrounds the second channel members 208A and in direct contact with the gate dielectric layer 272. In some embodiments, the fourth work function metal layer 292 is formed of TiN using a PVD or a CVD process. After the fourth work function metal layer 292 is deposited, a planarization process may then be performed to remove excess gate materials from the semiconductor device 200. The resultant structure is shown in FIG. 25. For example, a CMP process is performed to thin down the thickness of the fourth work function metal layer 292 to a required thickness. Up to here, a semiconductor device (e.g., transistor device) 200 is fabricated. According to some embodiments of the present disclosure, the semiconductor device 200 is a CMOS device.

Figure 26:
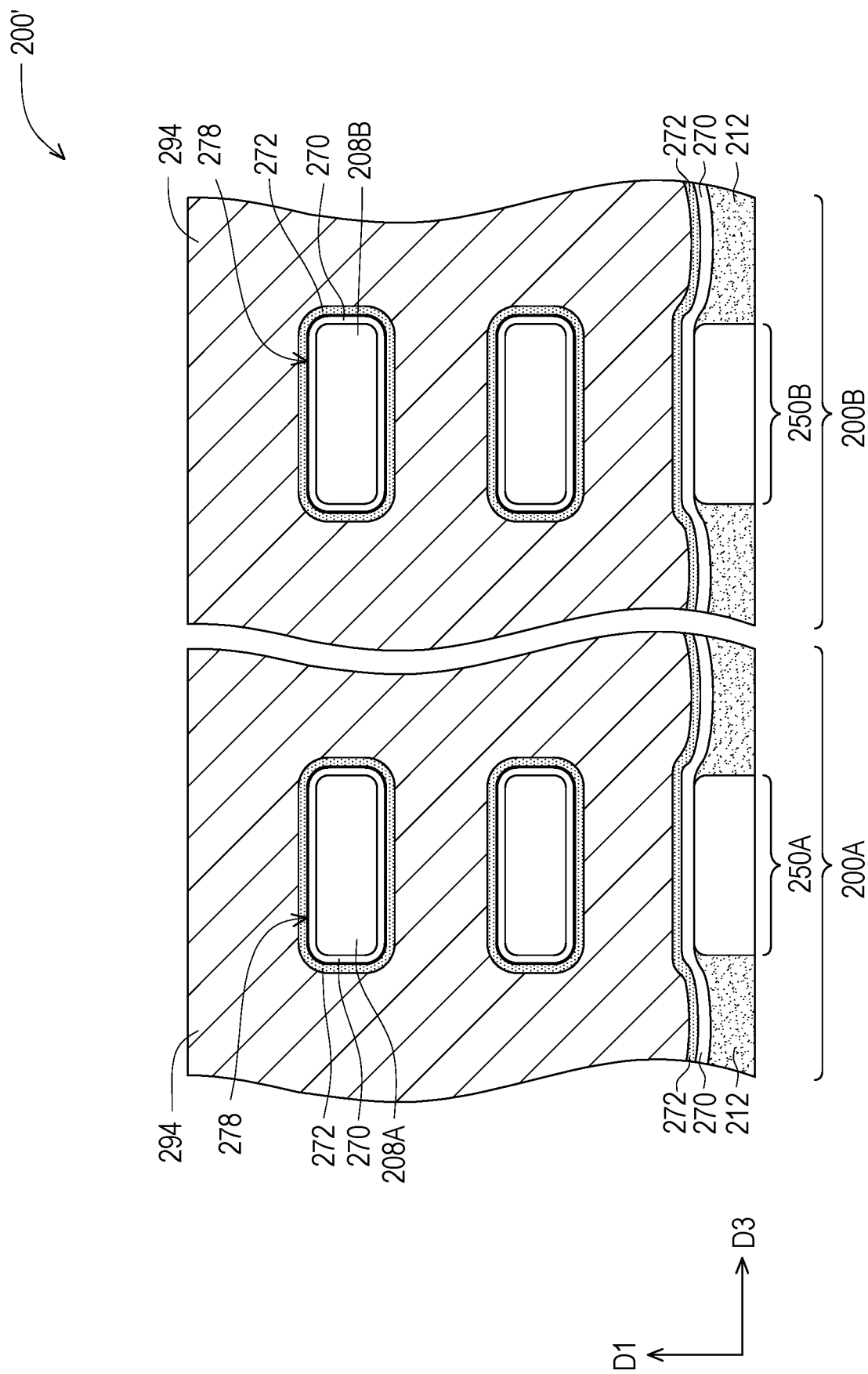
FIG. 26 is a fragmentary cross-sectional view of the first area and the second area of the structure after the method in FIG. 1 is completed.

FIG. 26 is a fragmentary cross-sectional view of the first area and the second area of the structure 200' after the method in FIG. 1 is completed. The structure (i.e., semiconductor device) 200' is similar to the structure 200 fabricated using method 100 with reference to FIG. 1. Similar elements have a same reference number. The difference between the structure 200' and the structure 200 lies in that a single work function metal layer 294 is deposited in the gap trenches in the first area 200A and the second area 200B. In such embodiments, the step 122 of the method 100 is omitted. For example, after the gate dielectric layer 272 is formed and the dipole metal elements are diffused into the gate dielectric layer 272, the work function metal layer 294 is formed surrounding the first channel members 208A in the first area 200A and the second channel members 208B in the second area 200B. By incorporating the dipole metal elements into the gate dielectric layer, multiple threshold voltages can be achieved in the semiconductor device 200' even with the same work function metal.

In accordance with an embodiment of the disclosure, a method for tuning a threshold voltage of a transistor is described. The method includes at least the following steps. A channel layer is formed over a substrate. An interfacial layer is formed over and surrounds the channel layer. A gate dielectric layer is formed over and surrounds the interfacial layer. A dipole layer is formed over and wraps around the gate dielectric layer by performing a cyclic deposition etch process, wherein the dipole layer comprises dipole metal elements and has a substantially uniform thickness. A thermal drive-in process is performed to drive the dipole metal elements in the dipole layer into the gate dielectric layer to form an interfacial dipole surface. The dipole layer is then removed.

In accordance with an embodiment of the disclosure, a method for fabricating a transistor with multiple threshold voltages is described. The method includes at least the following steps. A plurality of fin structures is formed over a substrate, wherein the fin structures comprise first semiconductor layers and second semiconductor layers vertically stacked in alternation. The fin structures is patterned to define channel regions. Source and drain features are formed at opposite sides of the channel regions. The second semiconductor layers are selectively removed so that sides of the first semiconductor layers in the channel regions are exposed. An interfacial layer is formed covering the exposed sides of the first semiconductor layers. A gate dielectric layer is formed over and surrounds the interfacial layer. A dipole layer is formed over and surrounds the gate dielectric layer by alternating performing deposition processes and etch processes, wherein the dipole layer includes dipole metal elements. The dipole metal elements of the dipole layer are diffused to an interface between the gate dielectric layer and the interfacial layer. The dipole layer is removed. A work function metal layer is formed surrounding the channel regions and covering the gate dielectric layer on the channel regions.

In accordance with yet another embodiment of the disclosure, a semiconductor device is described. The semiconductor device includes a substrate, a plurality of first channel members and a plurality of second channel members, and source and drain features. The plurality of first channel members and the plurality of second channel members are disposed over the substrate. The source and drain features are disposed beside the first channel members and disposed beside the second channel members. The semiconductor device further includes interfacial layers respectively surrounding surfaces of the first channel members and surrounding surfaces of the second channel members and gate dielectric layers respectively surrounding the interfacial layers. Interfacial dipole layers are respectively at interfaces between the interfacial layers and the gate dielectric layers. First work function metal layers are respectively disposed on the gate dielectric layers surrounding the first channel members and second work function metal layers are respectively disposed on the gate dielectric layers surrounding the second channel members.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for tuning a threshold voltage of a transistor, comprising:
   forming a channel layer over a substrate;
   forming an interfacial layer over and surrounding the channel layer;
   forming a gate dielectric layer over and surrounding the interfacial layer;
   forming a dipole layer over and wrapping around the gate dielectric layer by performing a cyclic deposition etch process, wherein the dipole layer comprises dipole metal elements and has a substantially uniform thickness;
   performing a thermal drive-in process to drive the dipole metal elements in the dipole layer into the gate dielectric layer to form an interfacial dipole surface; and
   removing the dipole layer.

2. The method of claim 1, wherein performing the cyclic deposition etch process comprises alternatingly performing deposition phases and etch phases.

3. The method of claim 2, wherein the dipole metal elements include zinc ions and the dipole layer includes zinc oxide.

4. The method of claim 3, wherein the zinc oxide is formed by performing the cyclic deposition etch process, and during the deposition phases, zinc oxide is formed through a reaction of diethylzinc and ozone.

5. The method of claim 4, wherein during the etch phases of the cyclic deposition etch process, trimethylaluminum (TMA) is used as an etchant for removing agglomerate of incompletely dissociated diethylzinc.

6. The method of claim 3, wherein the dipole layer further comprises aluminum oxide formed during the etch phases of the cyclic deposition etch process.

7. The method of claim 1, wherein the thermal drive-in process is performed at a temperature that selectively drives the dipole metal elements diffusing into the gate dielectric layer.

8. The method of claim 1, wherein the dipole metal elements diffuse out of the dipole layer into the gate dielectric layer, pass through the gate dielectric layer and accumulate at an interface between the gate dielectric layer and the interfacial layer during the thermal drive-in process.

9. The method of claim 1, wherein the thermal drive-in process is performed at a temperature that selectively drives the diffused dipole metal elements passing through the gate dielectric layer and the dipole metal elements accumulate at an interface between the gate dielectric layer and the interfacial layer.

10. A method for fabricating a transistor with multiple threshold voltages, comprising:
    forming a plurality of fin structures over a substrate, wherein the fin structures comprise first semiconductor layers and second semiconductor layers vertically stacked in alternation;
    patterning the fin structures to define channel regions;
    forming source and drain features at opposite sides of the channel regions;
    selectively removing the second semiconductor layers so that sides of the first semiconductor layers in the channel regions are exposed;
    forming an interfacial layer covering the exposed sides of the first semiconductor layers;
    forming a gate dielectric layer over and surrounding the interfacial layer;
    forming a dipole layer over and surrounding the gate dielectric layer by alternating performing deposition processes and etch processes, wherein the dipole layer includes dipole metal elements;
    diffusing the dipole metal elements of the dipole layer to an interface between the gate dielectric layer and the interfacial layer;
    removing the dipole layer; and
    forming a work function metal layer surrounding the channel regions and covering the gate dielectric layer on the channel regions.

11. The method of claim 10, wherein the dipole metal elements include zinc ions, and the dipole layer comprises zinc oxide and aluminum oxide.

12. The method of claim 10, wherein the dipole layer formed by alternating performing deposition processes and etch processes has a substantially uniform thickness and a substantially flat surface.

13. The method of claim 10, wherein diffusing the dipole metal elements of the dipole layer to an interface between the gate dielectric layer and the interfacial layer includes performing a selectively drive-in thermal process.

14. The method of claim 10, further comprising forming a capping layer over the dipole layer before diffusing the dipole metal elements of the dipole layer.

15. The method of claim 14, further comprising removing the capping layer before removing the dipole layer and before forming the work function metal layer.

16. The method of claim 15, wherein the work function metal layer is in contact with the gate dielectric layer.

17. A method comprising:
    forming a fin structure over a substrate, the fin structure comprising alternatingly stacking sacrificial layers and semiconductor layers;
    forming a dummy gate structure over the fin structure;
    removing the dummy gate structure to form a gate trench over the fin structure;
    forming channel members by removing the sacrificial layers leaving the semiconductor layers separated from each other and from the substrate by gaps therebetween;
    depositing an interfacial layer around the channel members;
    depositing a gate dielectric layer over the interfacial layer;
    forming a dipole layer comprising dipole metal elements over the gate dielectric layer by performing a multi-step process comprising a plurality of cycles, each cycle comprising:
        performing an atomic layer deposition (ALD) of a dipole material around the gate dielectric layer; and
        exposing the dipole material to a reactant to form the dipole layer; and performing an annealing process to drive the dipole metal elements from the dipole layer to the interfacial layer to form an interfacial dipole surface between the gate dielectric layer and the interfacial layer.

18. The method of claim 17, wherein the dipole material includes zinc oxide, and performing the ALD comprises reacting a zinc-containing precursor with an oxidizer to form the zinc oxide.

19. The method of claim 17, wherein the reactant includes trimethylaluminium.

20. The method of claim 17, further comprising forming a capping layer over the dipole layer before performing the annealing process.

* * * * *